(12) United States Patent
Matsushima

(10) Patent No.: US 6,359,665 B1
(45) Date of Patent: Mar. 19, 2002

(54) SWITCHING ELEMENT SUBSTRATE HAVING ADDITIONAL CAPACITY AND MANUFACTURING METHOD THEREOF

(75) Inventor: Yasuhiro Matsushima, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/648,553

(22) Filed: Aug. 28, 2000

Related U.S. Application Data

(62) Division of application No. 09/233,168, filed on Jan. 19, 1999, now Pat. No. 6,141,066, which is a division of application No. 08/718,051, filed on Sep. 13, 1996, now Pat. No. 5,917,563.

(30) Foreign Application Priority Data

| Oct. 16, 1995 | (JP) | 7-267308 |
| Dec. 13, 1995 | (JP) | 7-324578 |
| Apr. 24, 1996 | (JP) | 8-102817 |
| Jun. 13, 1996 | (JP) | 8-152729 |
| Jul. 24, 1996 | (JP) | 8-194451 |

(51) Int. Cl.[7] ........................... G02F 1/1343
(52) U.S. Cl. ........................... 349/38; 349/140
(58) Field of Search ................... 349/38, 39, 122, 349/138, 140; 257/68, 71, 277, 296, 532, 539

(56) References Cited

U.S. PATENT DOCUMENTS

| 5,084,905 A | 1/1992 | Sasaki et al. |
| 5,159,477 A | 10/1992 | Shimada et al. |
| 5,317,432 A | * 5/1994 | Ino ............................ 349/39 |
| 5,461,501 A | 10/1995 | Sato et al. |
| 5,585,951 A | 12/1996 | Noda |
| 5,721,601 A | 2/1998 | Yamaji et al. |
| 5,745,195 A | 4/1998 | Zhang |
| 5,767,927 A | * 6/1998 | Jang ........................... 349/39 |
| 5,784,131 A | * 7/1998 | Kim et al. ..................... 349/39 |
| 5,943,107 A | 8/1999 | Kadota et al. |
| 5,956,105 A | 9/1999 | Yamazaki et al. |

FOREIGN PATENT DOCUMENTS

| JP | 62-178296 | 8/1987 |
| JP | 1-33833 | 7/1989 |
| JP | 5-257164 | 10/1993 |
| JP | 07146491 | 6/1995 |

* cited by examiner

*Primary Examiner*—Kenneth Parker
(74) *Attorney, Agent, or Firm*—Nixon & Vanderhye P.C.

(57) ABSTRACT

A liquid crystal display device has a plurality of gate bus wirings and source bus wirings on one of paired substrates. Moreover, a inter-layer insulating film made of an organic material is provided on thin film transistors of respective picture elements, and a picture element electrode is provided on the inter-layer insulating film. Furthermore, the liquid crystal display device is provided with an additional capacity common wiring which is provided on the inter-layer insulating film and forms an additional capacity section between the picture element electrode and the additional capacity common wiring. As a result, the liquid crystal display device can realize high quality and a high aperture ratio.

16 Claims, 15 Drawing Sheets

SWITCHING ELEMENT SUBSTRATE HAVING ADDITIONAL CAPACITY AND MANUFACTURING METHOD THEREOF

This application is a divisional of application Ser. No. 09/233,168, filed Jan. 19, 1999 now 6,141,066, which is a divisional of application Ser. No. 08/718,051 filed Sep. 13, 1996, now U.S. Pat. No. 5,917,563.

FIELD OF THE INVENTION

The present invention relates to a liquid crystal display device including switching elements such as thin film transistors (TFT) on each picture element and relates to a manufacturing method thereof.

BACKGROUND OF THE INVENTION

The following describes an arrangement of a conventional liquid crystal display device in which a peripheral driving circuit is formed on one of paired substrates on reference to FIGS. 16 through 18.

FIG. 16 is a plan view showing a substrate on which a peripheral driving circuit is formed, and FIG. 17 is a drawing showing a layout of one picture element. Moreover, FIG. 18 is a cross-sectional view taken along line A—A in FIG. 17.

As shown in FIG. 16, a gate driving circuit 32, a source driving circuit 33 and a TFT array section 34 are formed on an insulating substrate 31 which is one of the substrates in the liquid crystal display device. As the insulating substrate 31, a glass substrate, a quartz substrate or the like is used. The gate driving circuit 32 is composed of a shift register 32a and a buffer 32b. Moreover, the source driving circuit 33 is composed of a shift register 33a, a buffer 33b and analog switches 39. The analog switches 39 sample video signals to be inputted from the outside to a video line 38.

A plurality of parallel gate bus wirings 116 which are extended from the gate driving circuit 32 are wired on the TFT array section 34. Moreover, a plurality of parallel source bus wirings 120 which are extended from the source driving circuit 33 wired on the TFT array section 34 so as to perpendicularly intersect to the gate bus wirings 116. The analog switches 39 are connected respectively to the source bus wirings 120. Moreover, additional capacity common wirings 114 are wired on the TFT array section 34 so as to be parallel with the gate bus wirings 116. Rectangular domains which are surrounded respectively by two gate bus wirings 116, two source bus wirings 120 and two additional capacity common wirings 114 are provided with thin film transistors (i.e. TFT) 35, picture elements 36 and additional capacities 37. The TFT 35 functions as a switching element which electrically connects the picture element 36, the gate bus wiring 116 and the source bus wiring 120. A gate electrode of the TFT 35 is connected to the gate bus wiring 116, and a source electrode of the TFT 35 is connected to the source bus wiring 120.

A drain electrode of the TFT 35 is connected to a picture element electrode of the picture element 36. The picture element 36 is composed of the picture element electrode a counter electrode provided on a counter substrate which faces the insulating substrate 31, and a liquid crystal layer sealed between the picture element electrode and the counter electrode. Moreover, the additional capacity common wiring 114 is connected to a electrode having the same electric potential as the counter electrode.

The following details the arrangement of the conventional TFT array section 34 in FIG. 16 on reference to FIGS. 17 and 18. A polycrystal silicon thin film 111 which is used as an active layer of the TFT 35 is formed on the insulating substrate 31 so as to have a thickness of, for example, 40 nm–80 nm. Then, a gate insulating film 113 is formed so as to have a thickness of, for example, 80 nm–150 nm by the sputtering or CVD method.

Phosphorus ions (P⁻) with concentration of $1\times10^{15}$ (cm$^{-2}$) are implanted into a section 110 (a shaded portion in FIGS. 17 and 18) of the polycrystal silicon thin film 111 where the additional capacity 37 will be formed.

A metal or polycrystal silicon layer with low resistance which is used as the gate bus wiring 116 and the additional capacity common wiring 114 are formed on the gate insulating film 113, and it is patterned so as to have a predetermined shape. As a result, a gate electrode 116a and an additional capacity upper electrode 114a are formed.

Thereafter, in order to determine a conduction type of the TFT 35, phosphorus ions (P⁺) with concentration of $1\times10^{15}$ (cm$^{-2}$) are implanted from the upper section of a gate electrode 116a, and a portion under the gate electrode 116a of the polycrystal silicon thin film 111 is a channel section 112 of the TFT 35.

A first inter-layer insulating film 115 is formed on the whole surface of the substrate 31 by using SiO$_2$ or SiN$_X$, and contact holes 118 and 119 are provided. Then, the source bus wiring 120 and a piling electrode (drain electrode) 121 are formed in the contact holes 118 and 119 by using metal with low resistance such as Al.

In the same manner as the first inter-layer insulating film 115, a second inter-layer insulating film 124 is formed on the whole surface of the substrate 31 by using SiO$_2$ or SiN$_X$, and a contact hole 123 is formed. Then, a picture element electrode 125 is formed by using a transparent conductive film such as ITO. When Al is used for the source bus wiring 120 and the piling electrode 121, for example, in order to bring the piling electrode 121 into ohmic contact with the picture element electrode 125, a barrier metal 126 is formed in the contact hole 123 by using metal such as Ti, TiW, Mo, MoSi.

However, the above-mentioned conventional liquid crystal display device has the following problems.

(1) First Problem

In the above arrangement, since the first and second inter-layer insulating films 115 and 124 are made of inorganic materials, the film thickness is small, i.e. several hundred nm, and the dielectric constant becomes higher than a usual organic material. For this reason, the capacity between the additional capacity common wiring 114 and the other wiring (for example, the source bus wiring 120) becomes large, the additional capacity common wiring 114 is easily influenced by the other wirings. Therefore, when inorganic materials are used for the inter-layer insulating films 115 and 124, it is not preferable that the additional capacity section is formed so as to greatly overlap the other wirings.

In addition, when the picture element electrode 125 is arranged so as to overlap the gate bus wiring 116 or the TFT 35 on an area connected to the picture element 36, capacity Cgd' is generated between the picture element electrode 125 and the gate bus wiring 116 or the TFT 35. When the TFT 35 is turned off, a voltage drop (ΔV) of the picture element electrode 125 represented by the following equation occurs.

$$\Delta V = \Delta Vg \times (Cgd + Cgd')/(Cgd + Cgd' + Cs + C_{LC})$$

(ΔVg: potential difference between on-state and off-state of the gate, Cgd: capacity between gate and drain of TFT, Cs: additional capacity, $C_{LC}$: liquid crystal capacity)

Since a d.c. component is applied to the liquid crystal due to the voltage drop, it is required to apply a bias voltage, for example, to the counter electrode.

In addition, since the additional capacity section does not have a light transmitting characteristic, an aperture ratio is lowered due to the additional capacity section. Moreover, the additional capacity common wiring 114 is formed on the layer where the gate bus wiring 116 is formed, and the additional capacity common wiring 114 does not have the light transmitting characteristic. As a result, the aperture ratio is lowered.

(2) Second Problem

Since the first inter-layer insulating film 115 is made of a inorganic material with a thickness of several hundred nm, disconnection of the source bus wiring 120 occurs due to unevenness of surface in a section where the source bus wiring 120 and the gate bus wiring 116 cross each other.

(3) Third Problem

In the above arrangement, the additional capacity common wiring 114 is formed by using the same material as the gate bus wiring 116, and the gate insulating film 113 just under the wiring 114 is used as a dielectric. Since the gate insulating film 113 is thin and its dielectric constant is high, even if the area is small, large additional capacity can be obtained. However, with this arrangement, when the gate bus wiring 116 is formed by a material with electrically higher resistance than the source bus wiring 120, propagation of a signal tends to be delayed in the additional capacity common wiring 114.

(4) Fourth Problem

In the liquid crystal display device having the above arrangement, a point-at-a time driving method is generally executed. As the other driving method, a line-at-a-time driving method exists, when the line-at-a-time driving is executed, a sampling capacitor for holding a sampled signal for 1 line is required. Moreover, since it is necessary to apply a transfer signal to be used for outputting the signals stored in the sampling capacitor to a hold capacitor all at once, the configuration of the circuit becomes complicated. The point-at-a-time driving does not require these capacitors, and thus a simple configuration of the circuit can be realized. Furthermore, the point-at-a-time driving method is usually used. However, the point-at-a-time driving method requires a higher speed of writing to the picture element through the TFT 35 compared to the line-at-a-time driving method. For this reason, when a-SiTFT is used as the TFT 35, the point-at-a-time driving is not executed, but when p-SiTFT is used, it can be executed.

In the point-at-a-time driving, video signals inputted to video lines 38 shown in FIG. 16 are successively sampled by the analog switches 39 of the source driving circuit 33 so as to be written to the source bus wirings 120. Thereafter, when the TFT 35 is turned on according to a signal from the gate driving circuit 32, the video signal written to the source bus wiring 120 is written to the picture element 36. Therefore, electric charges corresponding to the video signals written to the respective source bus wirings 120 should be securely held at least until the writing to all the source bus wirings 120 is completed.

When the capacity of the source bus wiring 120 is small, since an amount of electric charges written through the analog switches 39 is small, the writing to the picture element 36 is insufficient. As a result, insufficient contrast occurs. More specifically, when a inter-layer insulating film having a low dielectric constant and a large thickness is used, also the capacity formed in a portion where the source bus wiring 120 and another wiring cross each other becomes small. As a result, the capacity of the source bus wiring 120 becomes less and less.

As a method of preventing the insufficient contrast due to an insufficient capacity of the source bus wiring 120, for example, Japanese Unexamined Patent Publication No. 62-178296/1987 (Tokukaisho 62-178296) suggests that a sample hold capacity is formed by an MOS-type capacitor having the same structure as the TFT 35. However, such an MOS-type capacitor is liable to cause a dielectric breakdown due to static electricity during the rubbing treatment which is given to an alignment film on a side where the TFT 35 is provided after the process of manufacturing a substrate. Since the dielectric breakdown of the MOS-type capacitor causes a defect of line because a suitable signal cannot be written to the picture element which is connected to the source bus wiring 120 which is provided with this MOS-type capacitor.

As described in Japanese Unexamined Patent Publication No. 7-175082/1995 (Tokukaihei 7-175082), for example, such a defect of line can be corrected by forming a plurality of sample hold capacity parallel and by cutting off a defective capacity when the dielectric breakdown occurs. However, in this case, a new process for correcting the defect is added.

SUMMARY OF THE INVENTION

It is a first object of the present invention to provide a liquid crystal display device having high aperture ratio which does not cause lowering of the aperture ratio due to an additional capacity (common wiring).

Moreover, it is a second object of the present invention to prevent disconnection of a source bus wiring which is a conventional problem.

Furthermore, it is a third object of the present invention to provide a liquid crystal display device having high aperture ratio without a problem of delayed propagation of a signal in the additional capacity common wiring and a method of manufacturing the liquid crystal display device.

In addition, it is a fourth object of the present invention to provide a liquid crystal display device which includes a capacity having an arrangement without no defects in the source bus wiring, holding sufficient electric charges by means of the capacity and performing writing to picture elements.

In order to achieve the above objects, a liquid crystal display device of the present invention has:
  a plurality of scanning lines provided on one of paired substrates;
  a plurality of signal lines provided on the substrate so that the signal lines cross the scanning lines;
  switching elements provided respectively to cross sections of the scanning lines and the signal lines;
  a inter-layer insulating film made of an organic material provided on the switching elements;
  a picture element electrode provided on the inter-layer insulating film; and
  an additional capacity common wiring for forming an additional capacity section between the picture element electrode and the additional capacity common wiring, the additional capacity common wire being provided on said inter-layer insulating film.

In accordance with the above arrangement, the capacity between an additional capacity common wiring and the scanning lines or the signal lines can be ignored, and the additional capacity common wiring can be formed in a desired shape. For example, the additional capacity common wiring can be used as a light shielding film.

In the above arrangement, it is preferable that the above additional capacity common wiring is provided at least in a position where it overlaps the switching element. With this arrangement, the aperture ratio is hardly lowered due to the additional capacity common wiring. Moreover, in this case, it is desired that the additional capacity common wiring covers at least a PN junction in the switching element and functions as a light shielding film. As a result, the light directed to the liquid crystal display device 7 is not projected onto the switching element, thereby preventing lowering of display quality due to an increase in OFF-state currents.

Moreover, in the above arrangement, it is preferable that the additional capacity common wiring is provided at least in a position where it overlaps one of the scanning line and the signal line. With this arrangement, the lowering of the aperture ratio due to the additional capacity common wiring hardly occurs.

In addition, in the above arrangement, it is preferable that the additional capacity common wiring is made of a metal for bringing the drain electrode of the switching element into ohmic contact with the picture element electrode. When the additional capacity common wiring is formed by a metal for bringing the drain electrode into ohmic contact with the picture element electrode, the additional capacity lower electrode and the additional capacity common wiring as well as the metal can be simultaneously patterned. Therefore, an additional process for patterning the additional capacity lower electrode and the additional capacity common electrode is not required.

In addition, in the above arrangement, it is preferable that a counter substrate which is the other substrate of the paired substrates does not have a black matrix. Namely, in accordance with the arrangement that the counter substrate does not have a black matrix, it is not necessary to form a light shielding pattern in enough large size for its margin required for the lamination with the counter substrate. Therefore, the aperture ratio can be increased. Moreover, since only a transparent conductive film for switching a liquid crystal material is formed or the transparent conductive film and a color filter are formed on the counter substrate, the process for manufacturing the counter substrate becomes simple.

In addition, in the above arrangement, it is preferable that the dielectric constant of the insulating film used as a dielectric of the additional capacity is larger than the dielectric constant of the organic material used as the inter-layer insulating film. As a result, the additional capacity can be effectively formed in a small area.

It is preferable that an anodic oxide film is used as the dielectric of the additional capacity. Since the anodic oxide film has an excellent coating characteristic with respect to the additional capacity lower electrode and the additional capacity common wiring, the short-circuit of the additional capacity lower electrode and the additional capacity common wiring with the picture element electrode does not occur. Moreover, the process of forming an inorganic film by using the sputtering or CVD method is not required.

In addition, in order to achieve the above object, the liquid crystal display device of the present invention has:
a non-monocrystal silicon thin film, a gate insulating film and a gate bus wiring provided on one of paired substrates in this order;
a first inter-layer insulating film made of an organic material being laminated on the gate bus wiring; and
a source bus wiring, a second inter-layer insulating film and a picture element electrode being provided on the first inter-layer insulating film in this order.

In accordance with the above arrangement, since the first inter-layer insulating film is made of an organic material, a short-circuit between the gate bus wiring and the source bus wiring through the inter-layer insulating film generated when the inorganic material is used does not occur. Moreover, since the surface on which the source bus wiring is provided can be sufficiently made flat, the disconnection of the source bus wiring due to unevenness over the thin film transistor or the gate bus wiring can be prevented. Moreover, the capacity in the position where the gate bus wiring crosses the source bus wiring becomes smaller, thereby suppressing the delay of a signal generated in the bus wirings.

In the above arrangement, it is preferable that the second inter-layer insulating film is also made of an organic material. As a result, an electric field to be applied to the liquid crystal layer from the domain below the second inter-layer insulating film can be decreased.

Moreover, since the picture element electrode can be formed on the sufficiently flat surface, the rubbing process can be surely performed, thereby eliminating disorder of the alignment of liquid crystal.

In addition, it is preferable that the organic material is a photosensitive acrylic resin. When the photosensitive acrylic resin is used as the organic material, the contact hole can be easily formed by the exposing and developing processes, thereby simplifying the manufacturing process. Moreover, since the photosensitive acrylic resin has an excellent light transmitting characteristic, even when the liquid crystal display device is used as a transmission-type liquid crystal display device, the transmittance factor is not lowered.

In addition, in the above arrangement, it is preferable that the additional capacity is formed on the inner wall of at least one contact hole which goes through the first inter-layer insulating film. As a result, the non-light-transmitting domain due to the additional capacity can be small, thereby improving the aperture ratio of the liquid crystal display device.

In addition, it is preferable that a piling electrode is formed on the inner wall of the contact hole on which the above additional capacity is formed, and the piling electrode is used as a lower electrode of the additional capacity. As a result, the lower electrode of the additional capacity as well as the source bus wiring can be formed simultaneously, so it is not necessary to specially pattern the lower electrode of the additional capacity.

Furthermore, in the above arrangement, it is preferable that a light shielding film is formed on the first inter-layer insulating film. As a result, it is not necessary to form a light shielding film on the counter substrate, thereby further simplifying the manufacturing process. It is more preferable that the light shielding film is formed by the upper electrode of the additional capacity.

In addition, in order to achieve the above object, the liquid crystal display device of the present invention has:
a non-monocrystal silicon thin film, a gate insulating film and a gate bus wiring being provided in this order on one of paired substrates;
a first inter-layer insulating film, a source bus wiring, a second inter-layer insulating film and a picture element electrode being provided in this order on the gate bus wiring;
an additional capacity composed of an additional capacity upper electrode and an additional capacity lower electrode, the additional capacity upper electrode covering a contact hole provided on the first inter-layer insulating film and being made of the same material as the source bus wiring, the additional capacity lower electrode being made of the non-monocrystal silicon thin film.

In accordance with the above arrangement, since the additional capacity upper electrode is made of the same material as the source bus wiring, the resistance of the upper electrode is low, thereby arising no problems of the delayed propagation of a signal on the additional capacity upper electrode. Moreover, since the gate insulating film can be used as the dielectric of the additional capacity, the area of the additional capacity section as a light shielding film can be reduced.

In the above arrangement, it is preferable that the first inter-layer insulating film is formed by an organic material. As a result, the surface on which the source bus wiring is provided sufficiently flat, thereby preventing the disconnection of the source bus wiring due to unevenness over the thin film transistor or the gate bus wiring.

In addition, it is preferable that the organic material has photosensitivity. As a result, the contact hole can be formed on the first inter-layer insulating film only by the exposing and developing processes, thereby, simplifying the manufacturing process.

In addition, a method of manufacturing the liquid crystal display device having the above arrangement has:

the first step of forming the additional capacity lower electrode by using the non-monocrystal silicon; and the second step of forming the additional capacity upper electrode by using the same material as the source bus wiring so that the additional capacity upper electrode covers a contact hole provided on the first inter-layer insulating film.

In accordance with the above mentioned, the delayed propagation of signals on the addition capacity common electrode can be eliminated without adding a new device or process to the method of manufacturing a conventional liquid crystal display device. Moreover, since the gate insulating film is used as the dielectric of the additional capacity, an area of the additional capacity section as a light shielding film can be reduced, thereby improving the aperture ratio of a liquid crystal panel.

In addition, when the method of forming the first inter-layer insulating film by using a photosensitive organic material, the contact hole can be formed on the first inter-layer insulating film by an optical method, i.e. a simple manufacturing process without the etching process. As a result, damage to the gate insulating film due to the etching process does not occur.

In addition, in order to achieve the above object, the liquid crystal display device of the present invention has:

a pair of substrates;

a liquid crystal layer sandwiched between the pair of substrates;

a display section composed of a plurality of picture elements;

a plurality of picture element electrodes provided respectively on the plurality of picture elements on one of the paired substrates;

a plurality of gate bus wirings and a plurality of source bus wirings for driving the plurality of picture elements;

an inter-layer insulating film which covers the gate bus wirings and the source bus wirings;

switching elements provided in intersections of the gate bus wirings and the source bus wirings; and a covered electrode provided on a portion of the source bus wiring outside the display section, the covered electrode being connected to the source bus wiring through a contact hole of the inter-layer insulating film.

In accordance with the above arrangement, the contact hole is provided on the inter-layer insulating film on the source bus wiring located outside the display section, and the covered electrode is formed so as to cover the position of the source bus wiring. For this reason, when the pair of substrates are laminated, the disconnection of the source bus wiring in the section to which a sealing resin was applied can be prevented.

It is preferable that a counter electrode facing the covered electrode and the picture element electrode is formed on the other substrate, and the covered electrode, the counter electrode and the liquid crystal layer form a capacity for holding electric charges written to the source bus wiring. In other words, when the capacity is formed by the covered electrode, the liquid crystal material and the counter electrode, it is not necessary to form the capacity by specially utilizing the gate insulating film. Therefore, a defect in the lines due to an electrostatic breakage does not occur.

In addition, since the capacity of the source bus wiring can be larger, even if point sequential driving is performed, a decrease in an amount of the electric charges written from the analog switch can be prevented. Therefore, insufficient contrast, which is caused by insufficient writing of electric charges to picture elements, does not occur.

The covered electrode can be formed by the same material as the picture element electrode. Moreover, it is preferable that the covered electrode has a wider width than the source bus wiring.

In addition, the manufacturing process can be simplified by using a photosensitive acrylic resin as the inter-layer insulating film.

For fuller understanding of the nature and advantages of the invention, reference should be made to the ensuing detailed description taken in conjunction with the accompanying drawings.

DETAILED DESCRIPTION OF THE PREFERRED EMBODIMENTS

[Embodiment 1]

Figure 1:
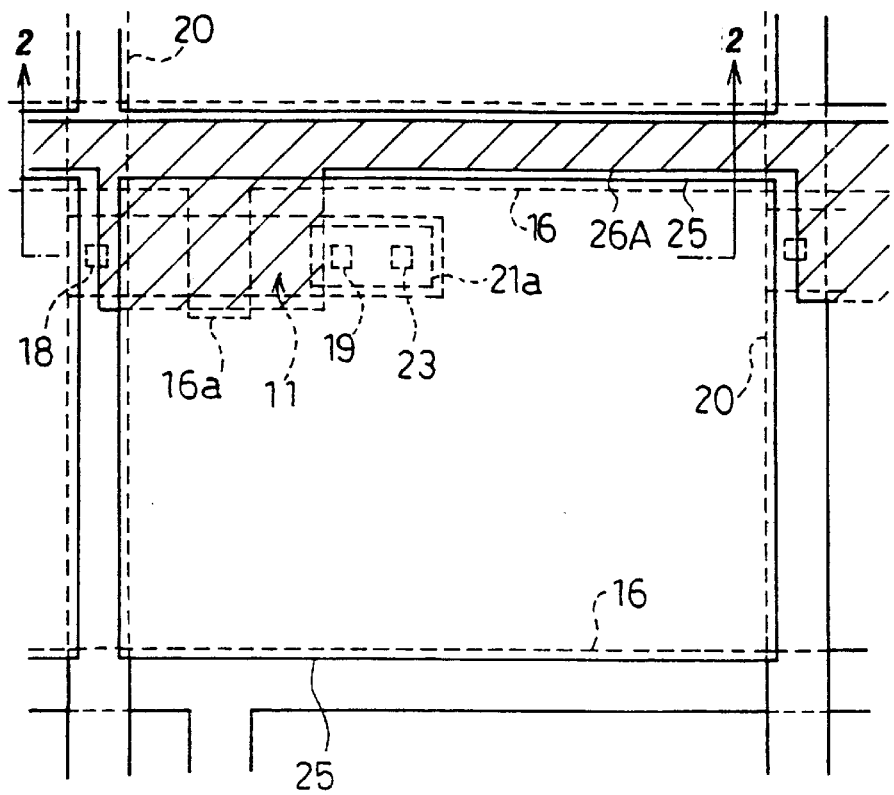
FIG. 1 is a drawing which shows a layout of one picture element in a liquid crystal display device according to one embodiment of the present invention.
Figure 2:
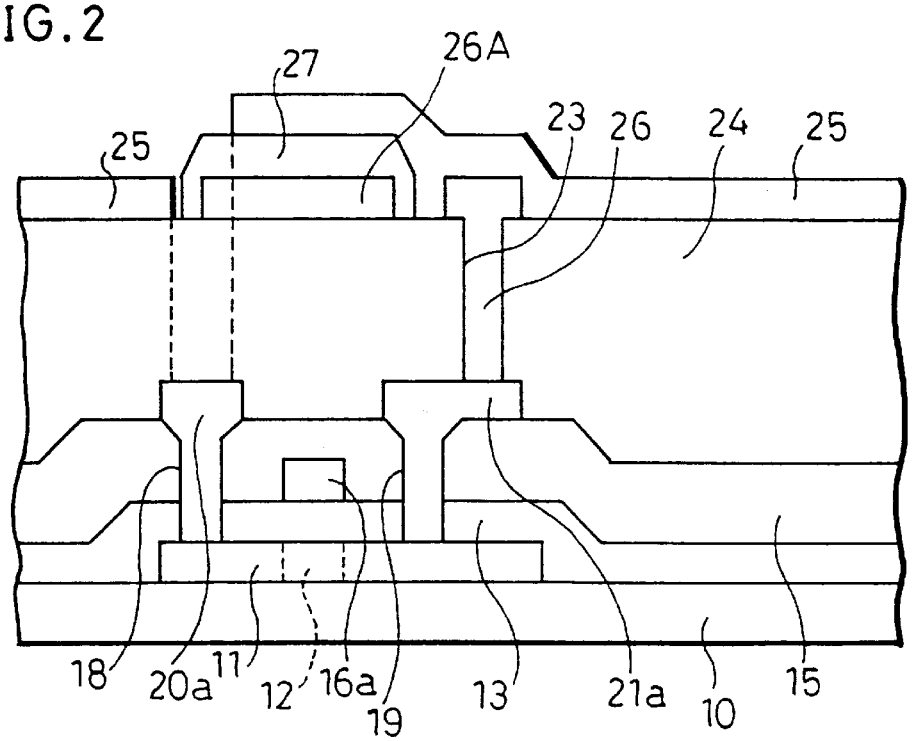
FIG. 2 is a cross-sectional view taken along line B—B in FIG. 1.

The following describes one embodiment of the present invention on reference to FIGS. 1 and 2.

FIG. 1 is a drawing which shows a layout of one picture element in the liquid crystal display device of the present embodiment, and FIG. 2 is a cross-sectional view taken along line B—B in FIG. 1.

Figure 16:
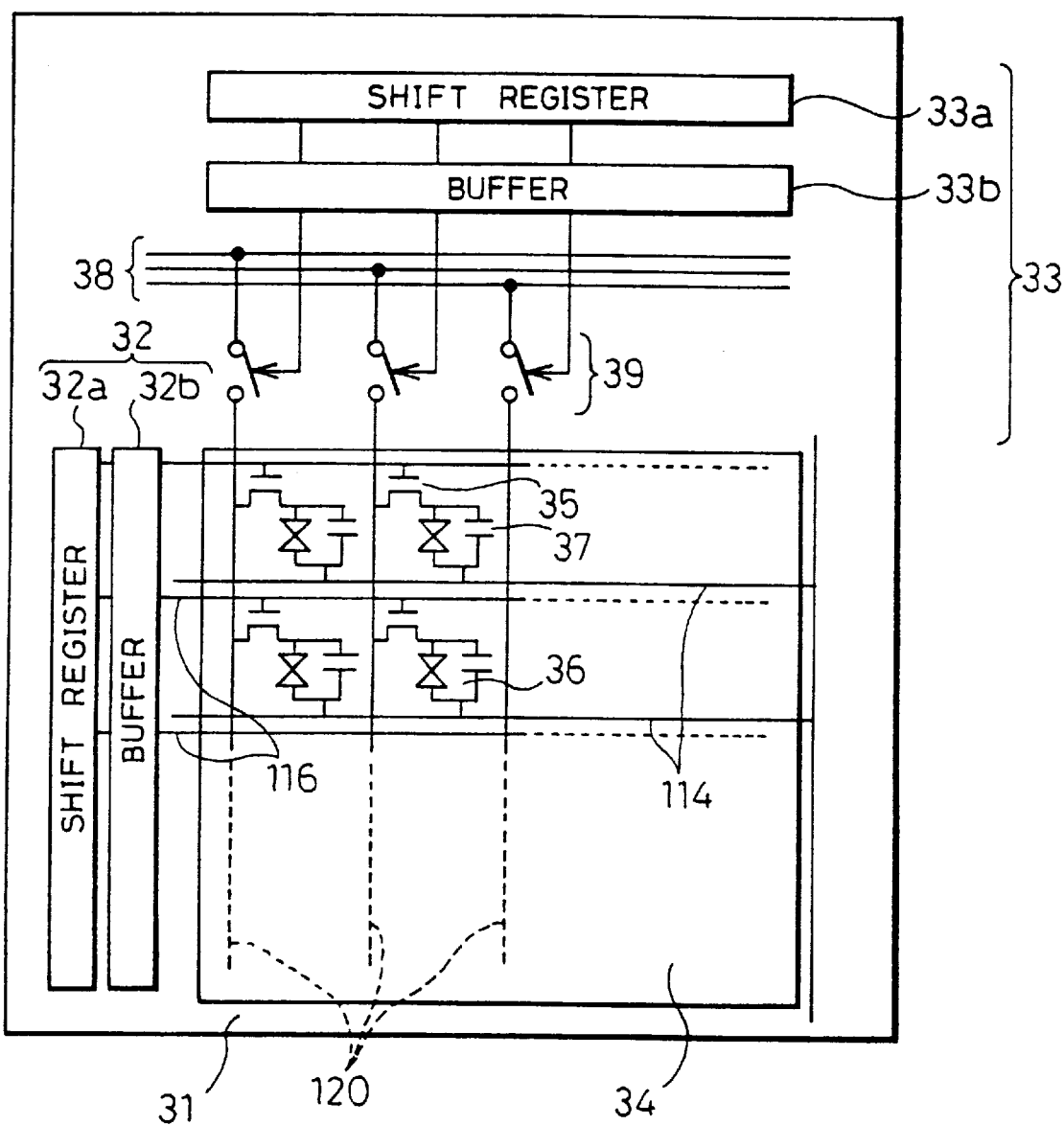
FIG. 16 is an explanatory drawing which shows an arrangement of a conventional liquid crystal display device in which a peripheral driving circuit is formed on one of the paired substrate.
Figure 17:
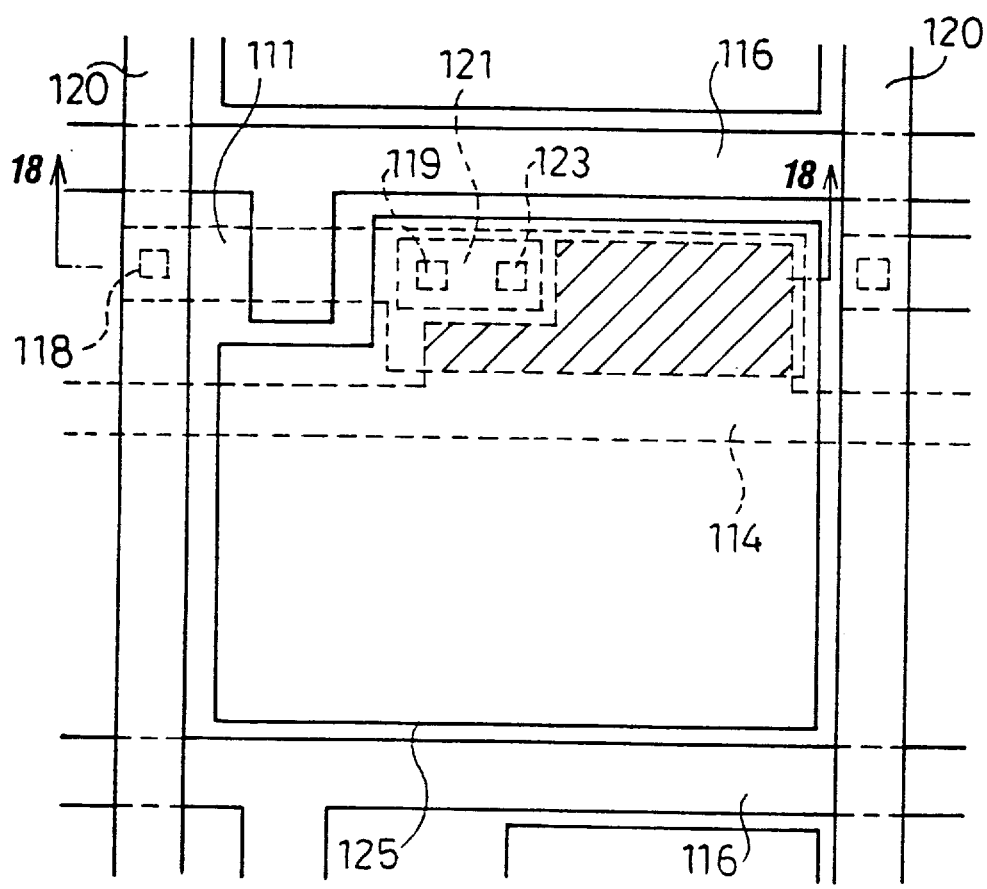
FIG. 17 is a drawing which shows a layout of one picture element in the above liquid crystal display device.
Figure 18:
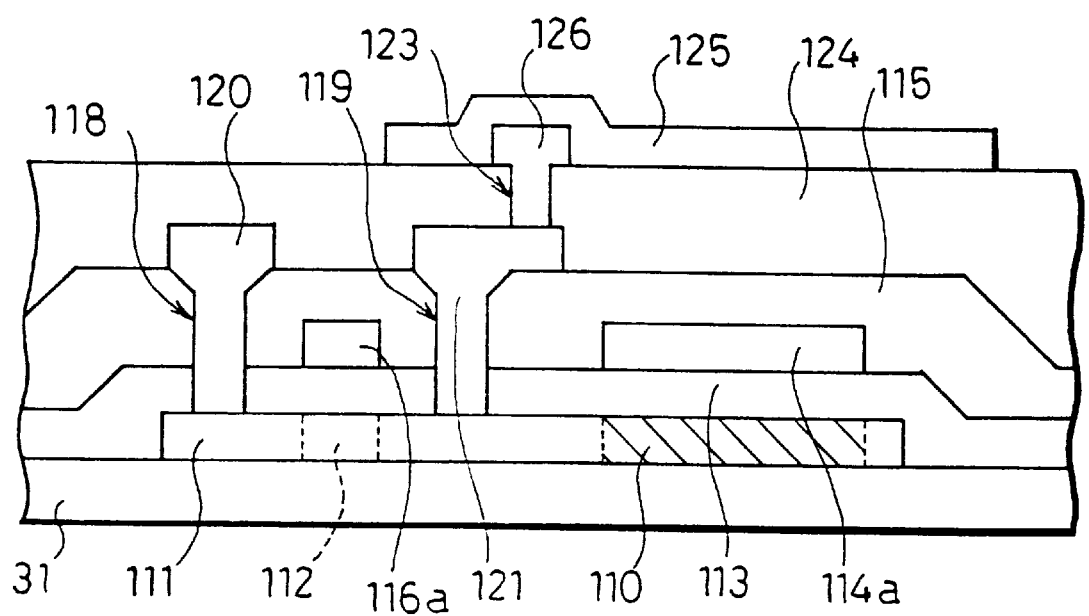
FIG. 18 is a cross-sectional view taken along line A—A in FIG. 17.

The liquid crystal display device of the present embodiment has a pair of substrates like the arrangement of a conventional liquid crystal display device shown in FIG. 16. Moreover, a gate driving circuit, a source driving circuit and a TFT array section are formed on an insulating substrate 10 which is one of the substrates. A lot of parallel gate bus wirings (scanning lines) 16 which are connected to the gate driving circuit are provided to the TFT array section. Moreover, a lot of parallel source bus wirings (signal lines) 20 which are connected to the source driving circuit are provided to the TFT array section so as to intersect perpendicularly to the gate bus wirings 16.

Furthermore, an additional capacity common wiring 26A is provided to the TFT array section of the liquid crystal display device so as to be parallel with the gate bus wiring 16.

In addition, in the liquid crystal display device, like the conventional arrangement, a rectangular domain which is surrounded by the two gate bus wirings 16, the two source bus wirings 20 and the additional capacity common wiring 26A is provided with a thin film transistor (i.e. TFT), a picture element and an additional capacity. The TFT functions as a switching element which electrically connects the picture element, the gate bus wiring 16 and the source bus wiring 20. A gate electrode 16a of the TFT is connected to the gate bus wiring 16, and a source electrode 20a of the TFT is connected to the source bus wiring 20.

A drain electrode 21a of the TFT is connected to a picture element electrode 25 of the picture element through a barrier metal 26. The picture element is composed of a picture element electrode 25, a counter electrode provided on a counter substrate which faces the insulating substrate 10, and a liquid crystal layer which is sealed between the picture element electrode 25 and the counter electrode. Moreover, the additional capacity common wiring 26A is connected to an electrode having the same electric potential as the counter electrode.

As shown in FIG. 2, the additional capacity common wiring 26A is formed on a second inter-layer insulating film 24 made of an organic material. Then, an additional capacity is formed by the additional capacity common wiring 26A and an insulating film 27 and the picture element electrode 25.

The following explains an example of a manufacturing method of the liquid crystal display device according to the present embodiment.

Similarly to the conventional example, a polycrystal silicon thin film 11 which becomes an active layer is formed on the insulating substrate 10 so as to have a thickness of 40 nm–80 nm. Then, a gate insulating film 13 is formed by using $SiO_2$ or $SiN_x$, by the sputtering or CVD method so as to have a thickness of 80 nm. The gate electrode 16a is formed together with the gate bus wiring 16 by using Al or polycrystal silicon.

Thereafter, in order to determine a conduction type of the TFT, phosphorus ions with concentration of $1 \times 10^{15}$ ($cm^{-2}$) are implanted from the upper side of the gate electrode 16a using the gate electrode 16a as a mask. As a result, a non-doped channel section 12 is formed under gate electrode 16a in the active layer, and domains other than the channel section 12 are made high-concentration impurity domains. The active layer of TFT can be arranged so that less leakage currents flow when the TFT is OFF state by providing a low-concentration impurity domains or non-doped domains to the proximity of the channel section 12.

Next, after a first inter-layer insulating film 15 was formed on the whole surface, contact holes 18 and 19 were provided. Then, the source electrode 20a and the drain electrode 21a were formed together with the source bus wiring 20 by using a metal having low resistance such as Al.

In the present embodiment, a transparent photosensitive organic film was formed by the spin coating method as the second inter-layer insulating film 24. When the second inter-layer insulating film 24 is photosensitive, the contact holes can be provided only by the exposing and developing processes, thereby simplifying the manufacturing process.

In addition, in the present embodiment, since a liquid crystal panel is used as a transmission-type liquid crystal display device, not a colored organic material but a transparent acrylic resin was used as a material of the second inter-layer insulating film 24. Since the dielectric constant of this organic film is small, i.e. not more than 4, and the film thickness is not less than 2 $\mu$m, liquid crystal is not influenced by an electric field from the part below the insulating film. For this reason, a reverse tilt of the liquid crystal material can be suppressed, and thus an angle of visibility of the liquid crystal panel can be also made large. Next, a contact hole 23 was provided by the exposing and developing processes.

The barrier metal 26, for bringing the drain electrode 21a into an ohmic contact with the picture element electrode 25 to be formed by ITO in the later step, was formed by metals such as TiW, Ti, Mo and MoSi. In the present embodiment, an additional capacity lower electrode, for forming the additional capacity between the picture element electrode 25 and the additional capacity lower electrode, and the additional capacity common wiring 26A were formed by using the metal so as to have a shape shown by a shaded portion in FIG. 1. A metal different from the barrier metal 26 may be used as the additional capacity lower electrode and the additional capacity common wiring 26A.

Next, the insulating film 27 was formed on the additional capacity lower electrode and the additional capacity common wiring 26A so that the additional capacity were formed. The insulating film 27 can be formed by the anodic oxidation method as long as the barrier metal 26 is made of an anodically oxidizable material such as Al or Ta. Since the anodic oxide film has larger dielectric constant than an ordinary inorganic film, the additional capacity can be effectively formed in a small area. Moreover, since the anodic oxide film has an excellent coating characteristic with respect to the additional capacity lower electrode and the additional capacity common wiring 26A, a short-circuit of the additional capacity lower electrode and the picture element electrode as well as a short-circuit of the additional capacity common wiring 26A and the picture element electrode do not occur. Moreover, a process for forming an inorganic film by the sputtering or CVD method is not required. In order to form the additional capacity effectively, it is desirable that the insulating film 27 is made of a material having the larger dielectric constant than the second inter-layer insulating film 24, a material having the small film thickness or a material having the large dielectric constant and the small film thickness. More specifically, the satisfactory dielectric constant is not less than 5, and not less than 8 is desirable. It is desirable that the film thickness of the additional capacity section is not more than 500 nm.

As shown in FIG. 1, the picture element electrode 25 was formed on the barrier metal 26, the additional capacity lower electrode and the additional capacity common wiring 26A so as to partially overlap the gate bus wiring 16 and the source bus wiring 20. As mentioned above, since the additional capacity is formed on the thick inter-layer insulating film 24, the additional capacity common wiring 26A can be formed in a desired position. As shown in FIG. 1, in the present embodiment, since the additional capacity is formed on the TFT, lowering of the aperture ratio due to the additional capacity does not occur. Moreover, since the adjacent picture elements are separated from each other on the wiring 26A, the wiring 26A functions as a light shielding film. Further, the non-light transmitting additional capacity lower electrode exists over the TFT, and since this electrode functions as a light shielding film, thereby making it possible to prevent the production of the leakage currents due to the projection of a light to a PN junction of the thin film transistor. In the present embodiment, since the light shielding film is formed on the substrate 10 on which the TFT is provided, it is not necessary to form a light shielding pattern on the counter substrate. As a result, a pattern of a transparent conductive film to be the counter electrode may be formed. Therefore, unlike the case where the light shielding pattern is formed on the counter substrate, it is not necessary to form the light shielding film so as to be enough large for a laminating margin, thereby making it possible to increase the aperture ratio.

[Embodiment 2]

Figure 3:
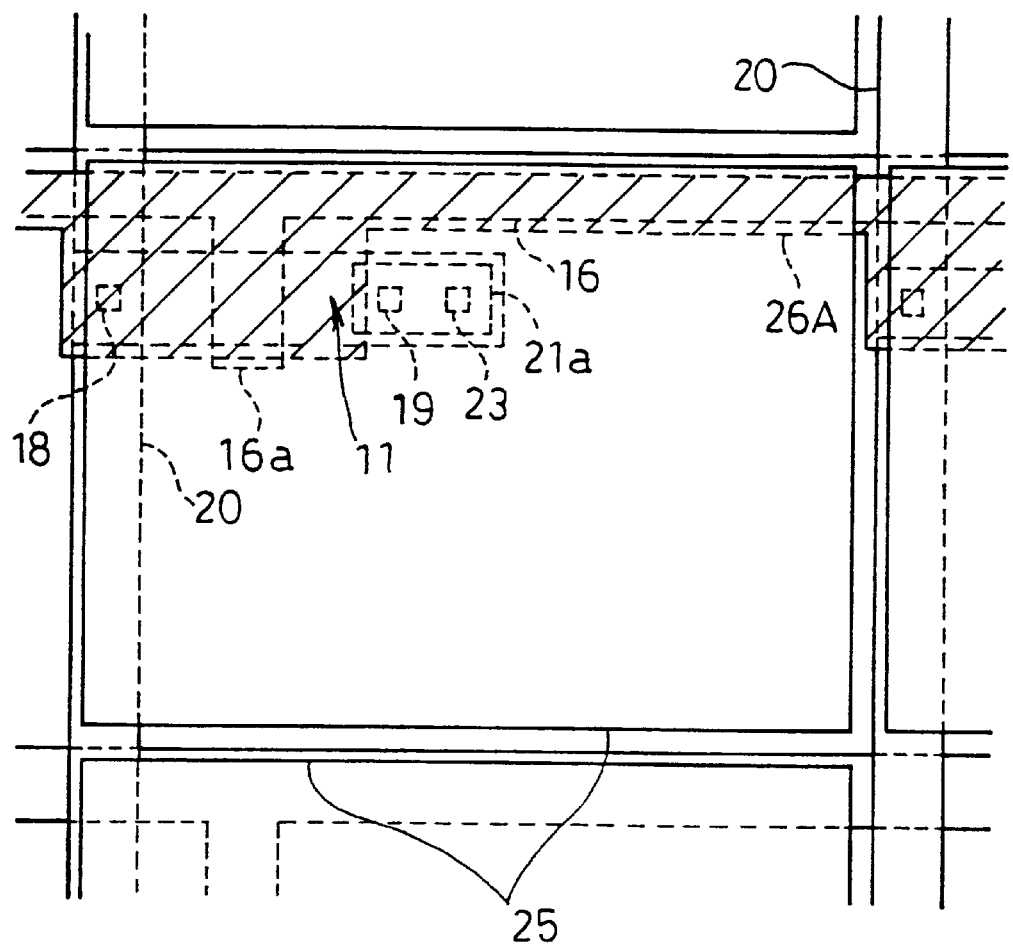
FIG. 3 is a drawing which shows a layout of one picture element in a liquid crystal display device according to another embodiment of the present invention.
Figure 4:
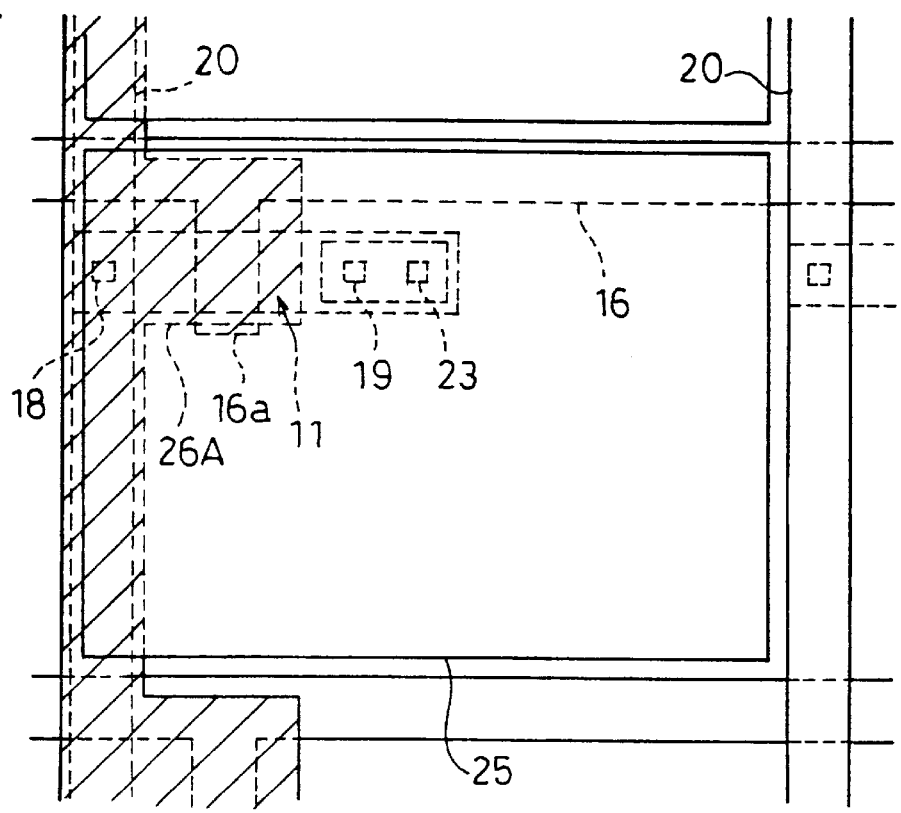
FIG. 4 is a drawing which shows a layout of one picture element in a liquid crystal display device according to still another embodiment of the present invention.

The following describes another embodiment of the present invention in reference to FIGS. 3 and 4. Here, for convenience of explanation, those members that have the same arrangement and functions, and that are described in the aforementioned embodiment 1 are indicated by the same reference numerals and the description thereof is omitted.

In a liquid crystal display device of the present embodiment, the additional capacity is formed on the bus wiring 16 or 20.

In the present embodiment, the manufacturing process up to the step of forming the second inter-layer insulating film 24 by using the organic film made of an acrylic resin or the like is the same as the embodiment 1. As to the organic film, since the dielectric constant is small and the film thickness is thick, i.e. not less than 2 $\mu$m, a capacity between the picture element electrode 25 and the bus wiring 16 or 20 can be ignored. Therefore, there arises no problem even if the picture element electrode 25 is formed over the gate bus wiring 16. As a result, as shown in FIG. 3, when the picture element electrode 25 overlaps the gate bus wiring 16 in the same stage as the electrode 25 and when the additional capacity lower electrode and the additional capacity common wiring 26A are formed over the gate bus wiring 16, the additional capacity can be formed over the gate bus wiring 16 and the TFT. In this case, since the additional capacity is formed not only over the TFT but also over the gate bus wiring 16, the domain for the additional capacity can be large.

Similarly, the picture element electrode 25 can be formed over the source bus wiring 20. Therefore, as shown in FIG. 4, the picture element electrode 25 overlaps the source bus wiring 20 in the same stage as the electrode 25, and the additional capacity lower electrode and the additional capacity common wiring 26A are formed over the source bus wiring 20 so that the additional capacity can be formed over the source bus wiring 20 and the TFT. In this case, since the additional capacity is formed not only over the TFT but also over the source bus wiring 20, the domain of the additional capacity can be large.

[Embodiment 3]

Figure 5:
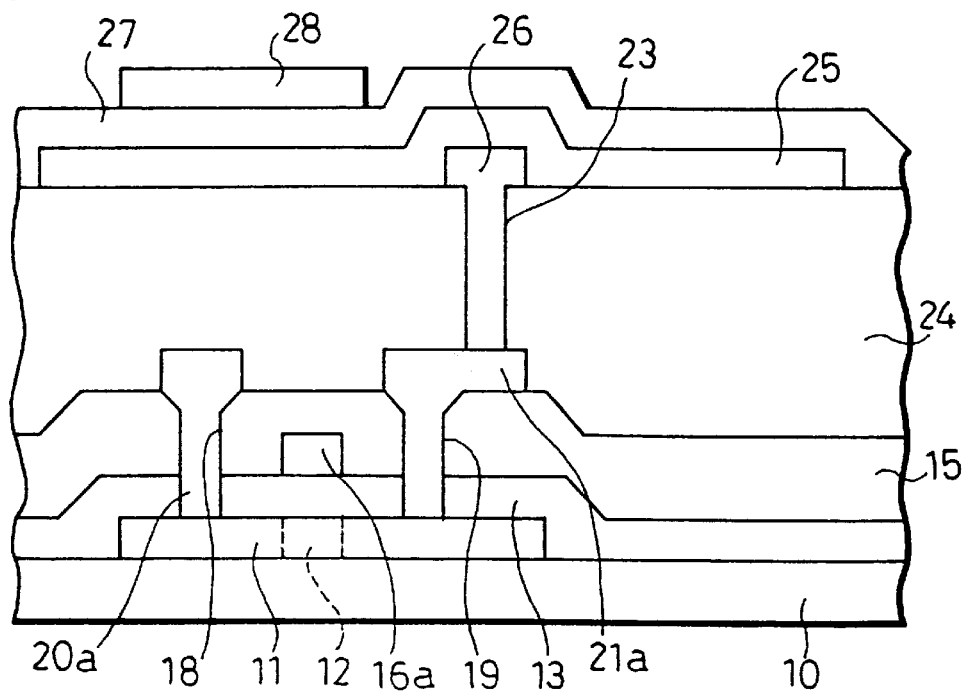
FIG. 5 is a cross-sectional view of picture elements in a liquid crystal display device according to still another embodiment of the present invention.

The following describes still another embodiment of the present invention in reference to FIG. 5. Here, for convenience of explanation, those members that have the same arrangement and functions, and that are described in the aforementioned embodiments are indicated by the same reference numerals and the description thereof is omitted.

In embodiment 1, as shown in FIG. 2, the additional capacity lower electrode and the additional capacity common wiring 26A are formed before forming the picture element electrode 25. On the contrary, in the present embodiment, as shown in FIG. 5, the insulating film 27 and an additional capacity electrode 28 which is one electrode of the additional capacity are provided on the picture element electrode 25. Namely, after forming the picture element electrode 25, the insulating film 27 and the additional capacity electrode 28 are formed.

The following explains a manufacturing method of the present embodiment on reference to FIG. 5.

First, similarly to embodiment 1, after forming the TFT on the insulating substrate 10, the second inter-layer insulating film 24 was formed by using an organic material, and the contact hole 23 was provided.

Then, only the barrier metal 26 was formed and the picture element electrode 25 was formed thereon.

Thereafter, the insulating film 27 was formed, and a metal which is a material of the additional capacity electrode 28 was formed thereon so as to cover the whole surface of the substrate. The metal was patterned, and the additional capacity electrode 28 was formed over the TFT similarly to embodiments 1 and 2. Moreover, similarly to embodiment 2, the additional capacity electrode 28 may be formed over the gate bus wiring 16 or the source bus wiring 20. Also in the present embodiment, when a material having the large dielectric constant or a material having the small film thickness is used as the insulating film 27, the additional capacity can be formed in a small area effectively.

If the insulating film 27 is left when additional capacity electrode 28 is patterned, the insulating film 27 also functions as a protective film. An arbitrary metal can be used as the additional capacity electrode 28, so the same material as the gate bus wiring 16, the source bus wiring 20 or the picture element electrode 25, for example may be used. Moreover, unlike embodiment 1, it is not necessary to form the insulating film 27 only on the additional capacity lower electrode and the additional capacity common wiring 26A, and the insulating film is formed on the picture element electrode 25 so as to cover the whole surface of the substrate. Therefore, it is not necessary to pattern the insulating film 27.

[Embodiment 4]

Figure 6:
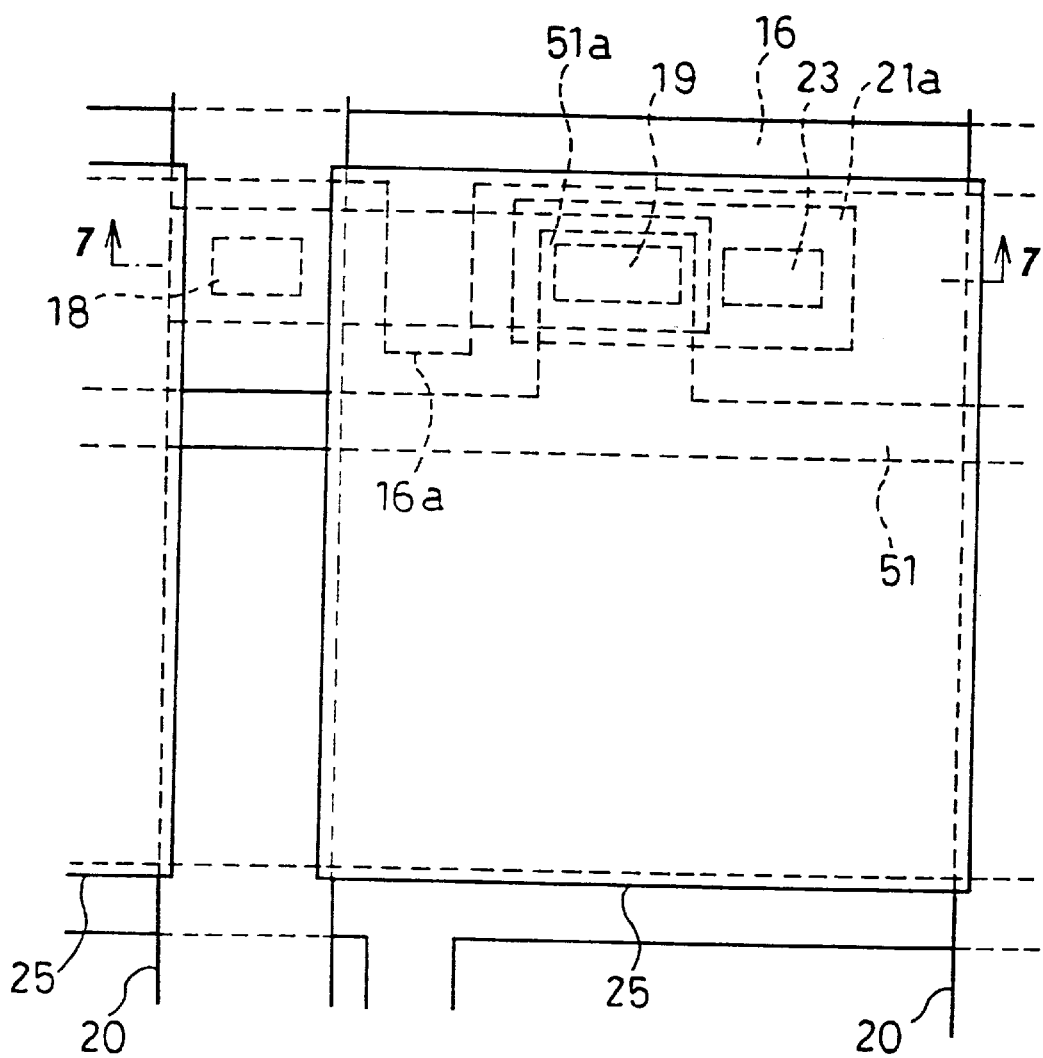
FIG. 6 is a drawing which shows a layout of one picture element in a liquid crystal display device according to still another embodiment of the present invention.
Figure 7:
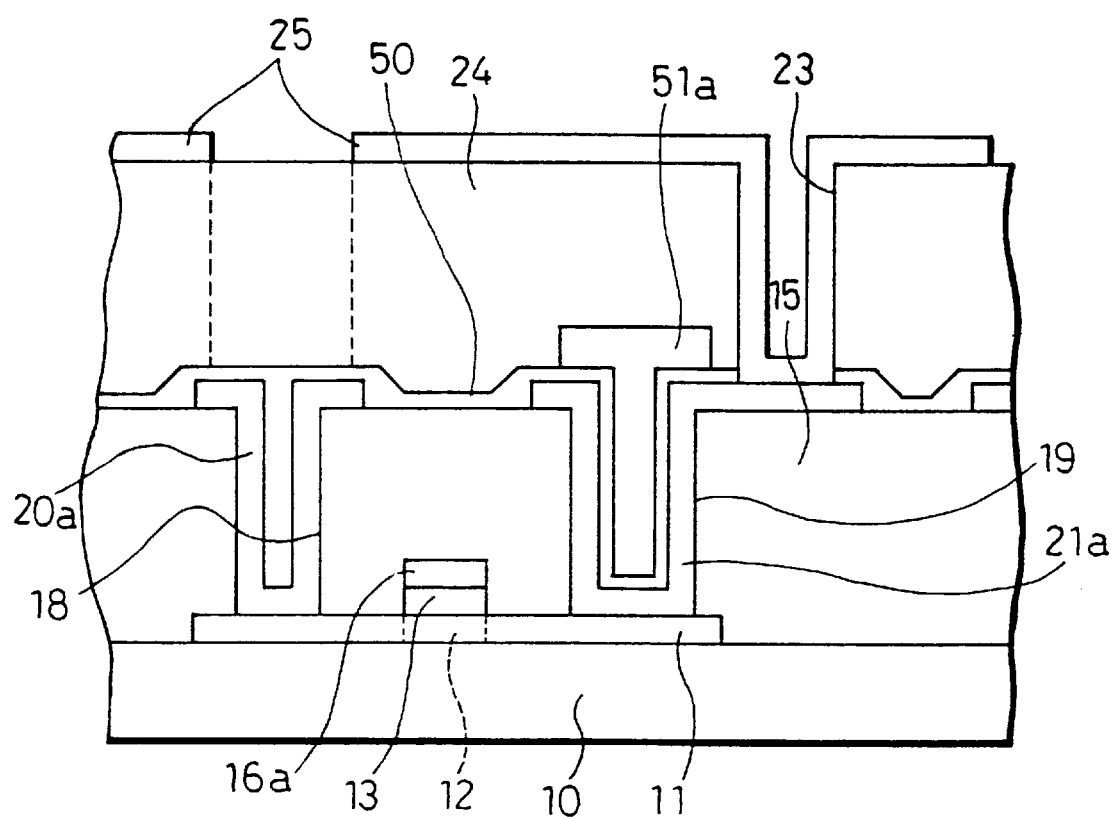
FIG. 7 is a cross-sectional view taken along line C—C in FIG. 6.

The following describes still another embodiment of the present invention in reference to FIGS. 6 and 7. Here, for convenience of explanation, those members that have the same arrangement and functions, and that are described in the aforementioned embodiments are indicated by the same reference numerals and the description thereof is omitted.

FIG. 6 is a drawing which shows a layout of one picture element in the liquid crystal display device of the present embodiment, and FIG. 7 is a cross-sectional view taken along line C—C in FIG. 6.

In the liquid crystal display device of the present embodiment, the first inter-layer insulating film 15 is formed by using a photosensitive acrylic resin which is an organic material.

In addition, the additional capacity is formed on an inner wall of the contact hole 19 which goes through the first inter-layer insulating film. Namely, the drain electrode (piling electrode) 21a is provided to the inner wall of the contact hole 19, and the drain electrode 21a is the lower electrode of the additional capacity. Moreover, an insulating film 50 and an upper electrode 51a for forming the additional capacity are provided to the contact hole 19.

The following explains a manufacturing method of the liquid crystal display device of the present embodiment.

First, similarly to embodiment 1, the polycrystal silicon thin film 11 to be an active layer was formed on the insulating substrate 10 made of glass, quartz or the like so as to have a thickness of 40 nm–80 nm. Next, the gate insulating film 13 made of $SiO_2$ or $SiN_x$ was formed on the center portion of the polycrystal silicon thin film 11 by the sputtering or CVD method so as to have a thickness of 80 nm. Furthermore, the gate electrode 16a made of Al or polycrystal silicon was formed on the gate insulating film 13 so as to have a thickness of 30 nm.

Thereafter, phosphorus ions ($P^+$) with concentration of $1 \times 10^{15}$ ($cm^{-2}$) were implanted from the upper side of the gate electrode 16a by using the gate electrode 16a as a mask so that the conduction type of the TFT is determined. As a result, the non-doped channel section 12 was formed under the gate electrode 16a in an active layer, and high-concentration impurity domains were formed on domains other than the channel section 12. At this time, the leakage currents at the time of turning off the TFT can be decreased by providing a low-concentration impurity domain or a non-doped domain to the proximity of the channel section 12 on the active layer of the TFT.

Next, the first inter-layer insulating film 15 was formed on the whole surface of the substrate 10 by using a photosensitive acrylic resin by the spin coating method so as to have a film thickness of 2.5 $\mu$m. Thereafter, the contact holes 18 and 19 were formed on the first inter-layer insulating film 15 by the exposing and developing processes.

Here, since the first inter-layer insulating film 15 of not less than 2 $\mu$m was laminated, the upper surface of the first inter-layer insulating film 15 can be flat. Moreover, since the photosensitive material was used as the first inter-layer insulating film 15, the contact holes 18 and 19 can be formed only by the exposing and developing processes, thereby simplifying the manufacturing process.

Next, the source electrode 20a and the drain electrode 21a were formed by using a low-resistant metal such as Al so as to respectively cover the inner wall of the contact holes 18 and 19. At this time, the source bus wiring 20 is provided together with the source electrode 20a on the first inter-layer insulating film 15. Since the lower surface on which the source bus wiring 20 is provided is made flat by the first inter-layer insulating film 15, disconnection of the source bus wiring 20 due to unevenness of the surface does not occur even in the section where the source bus wiring 20 crosses the gate bus wiring 16. Moreover, when the photosensitive acrylic resin material, which has a smaller dielectric constant than an inorganic material, is used as the first inter-layer insulating film 15, the film thickness can be made large. As a result, the capacity in the section where the source bus wiring 20 crosses the gate bus wiring 16 can be ignored, thereby preventing the delay of a signal generated in the bus wiring.

In addition, the drain electrode 21a is formed along the inner wall of the contact hole 19, and it functions as a lower electrode for forming the additional capacity.

Next, the insulating film 50 was formed on the whole surface of the substrate 10 by using $SiN_x$ or the like so as to have a thickness of 50 nm. At this time, the insulating film 50 is also formed along the inner wall of the contact hole 19 like the drain electrode 21a. The insulating film 50 functions as an insulating film for forming the additional capacity.

Then, the upper electrode 51a for forming the additional capacity is formed over the contact hole 19 by using a metal such as Ta or Al, and at the same time an additional capacity common wiring 51 is also formed. At this time, since the film thickness of the first inter-layer insulating film 15 is thicker than the conventional one, i.e. 2.5 $\mu$m, a surface area of the inner wall of the contact hole 19 becomes larger. As a result, the additional capacity value can take a sufficiently large value.

Here, a simple explanation will be given as to the value of the additional capacity.

If an inner diameter of an additional capacity upper electrode 51a in the contact hole 19 is, for example, 5 $\mu$m, the surface area becomes 5×5 (bottom)+5×2.5×4 (side)=75 ($\mu m^2$) Then, the capacity $C_{OX}$ per unit area of $SiN_x$ of 50 nm is $1.4 \times 10^{-3}$ ($pF/\mu m^2$), thereby making it possible to obtain the additional capacity value of 0.11 pF only in the contact hole 19. If the additional capacity is formed in a plane shape, the domain of 75 ($\mu m^2$) is required for the additional capacity. However, since this additional capacity domain does not transmit a light, the aperture ratio is lowered by this domain. In the present embodiment, even if the additional capacity value is not sufficient, the additional capacity value can be supplemented by forming the contact hole 19 in larger size or forming the plane capacity supplementally.

Next, the second inter-layer insulating film 24 was formed on the whole surface of the substrate 10 by using a photosensitive acrylic resin similarly to the first inter-layer insulating film 15. Then, the second inter-layer insulating film 24 was exposed and developed, and the insulating film 50 was etched so that the contact hole 23 which goes through the second inter-layer insulating film 24 and the insulating film 50 was formed. Moreover, the picture element electrode 25 was formed by using a transparent conductive film such as ITO so as to cover the contact hole 23. At this time, when an ohmic characteristic of the contact between the drain electrode 21a and the picture element electrode 25 is required, a barrier metal may be formed on the contact hole 23.

In the present embodiment, since the photosensitive acrylic resin was used for the second inter-layer insulating film 24, similarly to the first inter-layer insulating film 15, an electric field, which is applied to the liquid crystal layer from the domain below the second inter-layer insulating film 24, can be ignored. Moreover, since the picture element electrode 25 is formed on the sufficiently plane domain, the secure rubbing process can be performed. Therefore, disorder of the alignment of liquid crystal does not occur.

[Embodiment 5]

Figure 8:
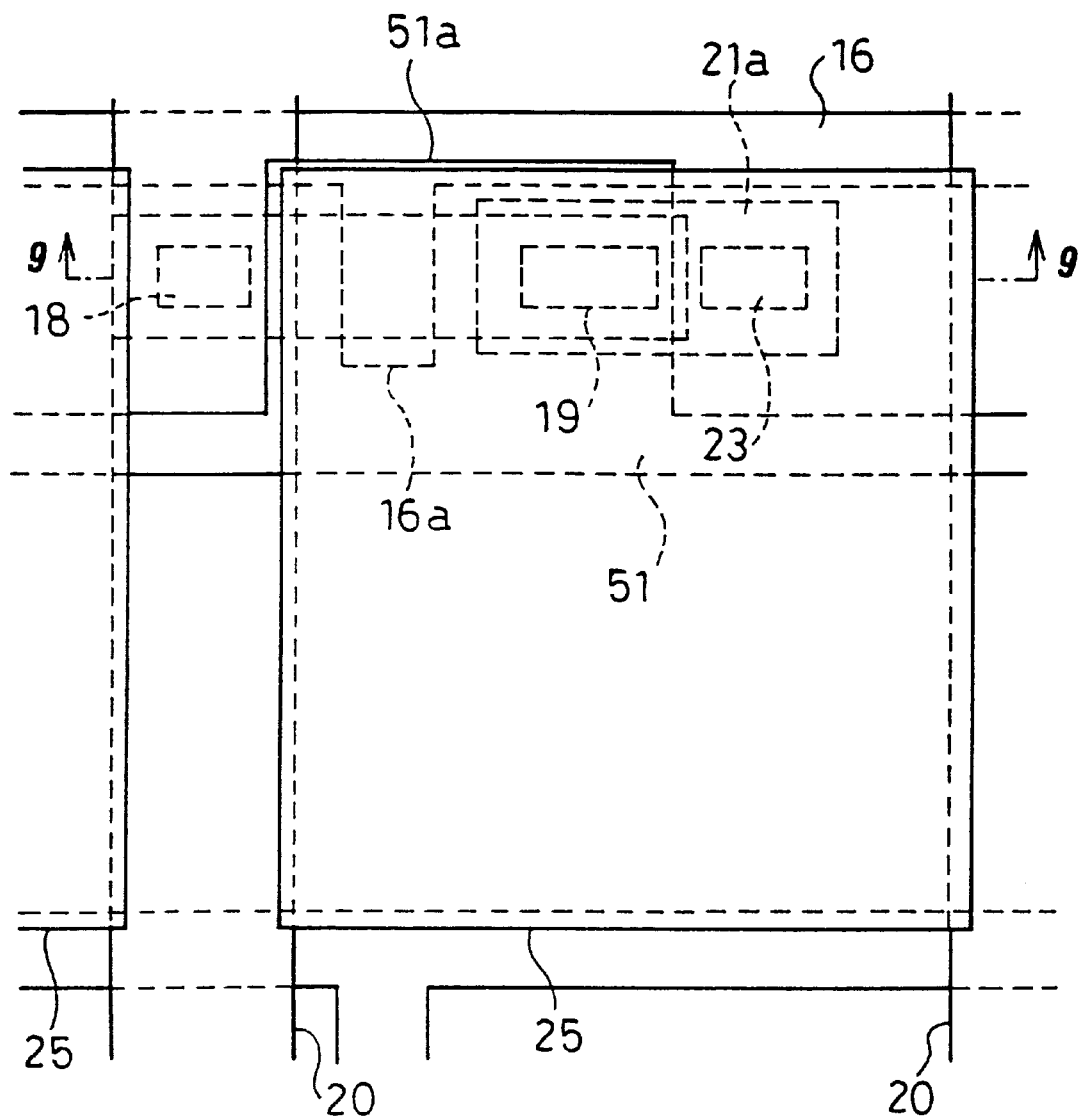
FIG. 8 is a drawing which shows a layout of one picture element in a liquid crystal display device according to still another embodiment of the present invention.
Figure 9:
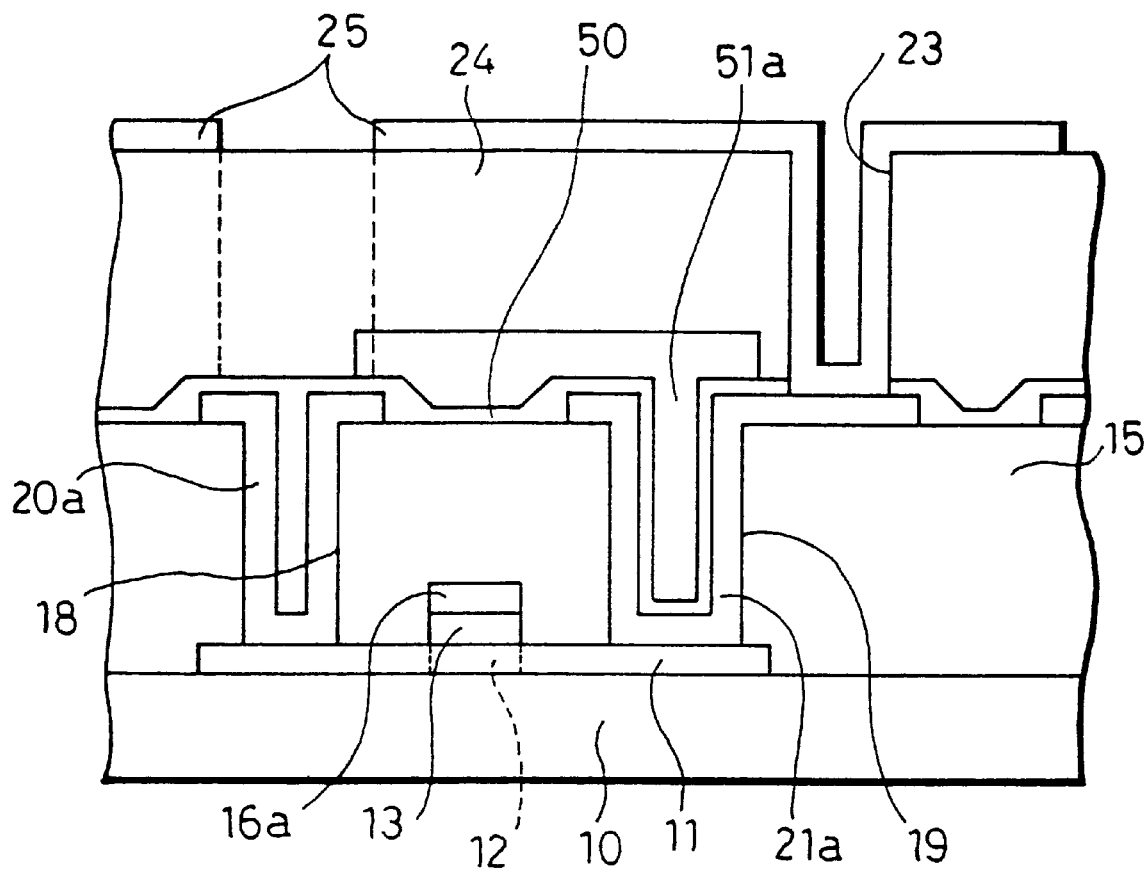
FIG. 9 is a cross-sectional view taken along line D—D in FIG. 8.

The following describes still another embodiment of the present invention in reference to FIGS. 8 and 9. Here, for convenience of explanation, those members that have the same arrangement and functions, and that are described in the aforementioned embodiments are indicated by the same reference numerals and the description thereof is omitted.

FIG. 8 is a drawing which shows a layout of one picture element in the liquid crystal display device of the present embodiment, and FIG. 9 is a cross-sectional view taken along line D—D in FIG. 8.

In the liquid crystal display device of the present embodiment, additional capacity upper electrode 51a is extended above the TFT. The other arrangement and the manufacturing method are the same as embodiment 4.

In accordance with the above arrangement, since the gate bus wiring 16, the source bus wiring 20 and the additional capacity upper electrode 51a function as a light shielding film, it is not necessary to form a light shielding film on the counter substrate. Therefore, the manufacturing process can be further simplified.

[Embodiment 6]

Figure 10:
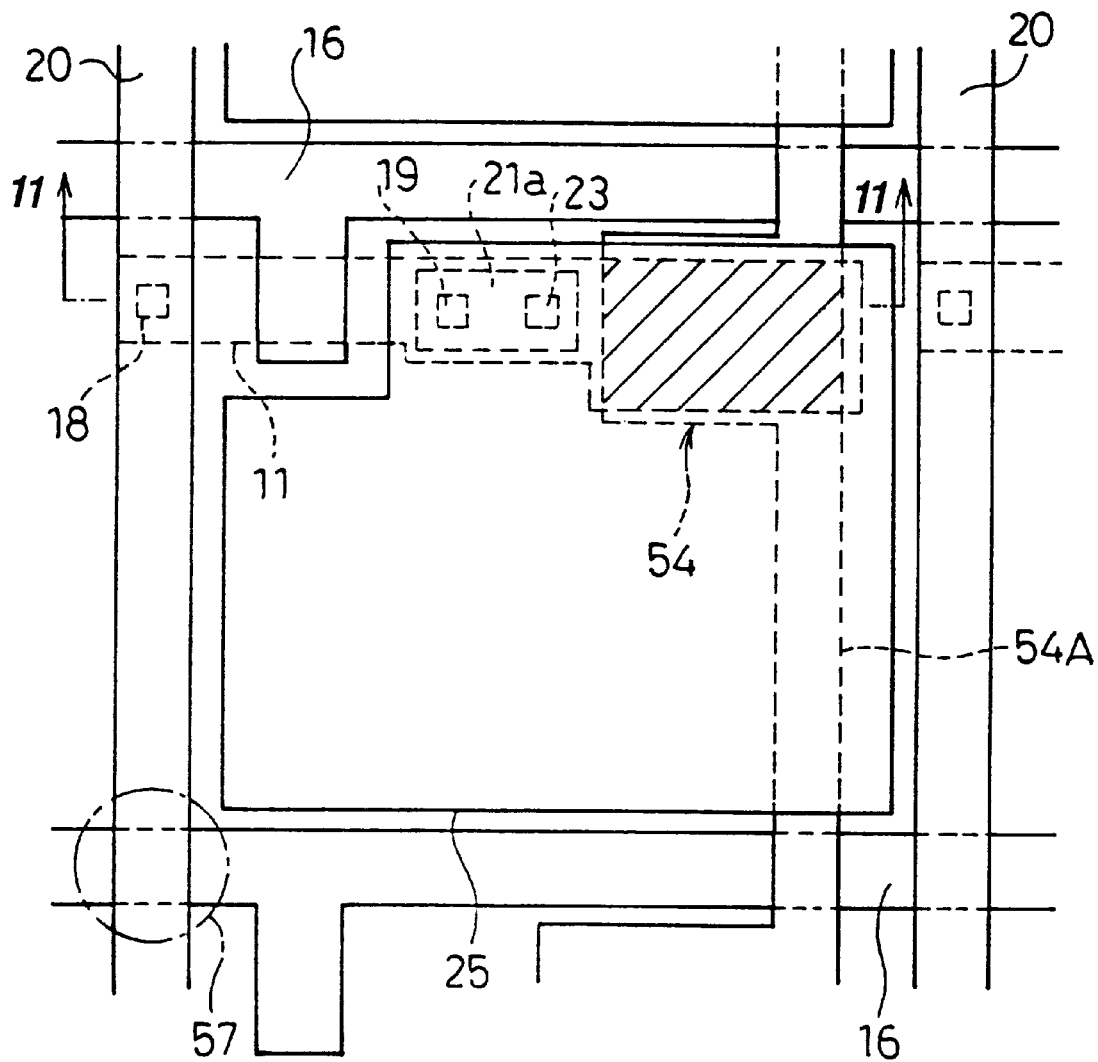
FIG. 10 is a drawing which shows a layout of one picture element in a liquid crystal display device according to still another embodiment of the present invention.

The following describes still another embodiment of the present invention in reference to FIGS. 10 and 12. Here, for convenience of explanation, those members that have the same arrangement and functions, and that are described in the aforementioned embodiments are indicated by the same reference numerals and the description thereof is omitted.

Figure 11:
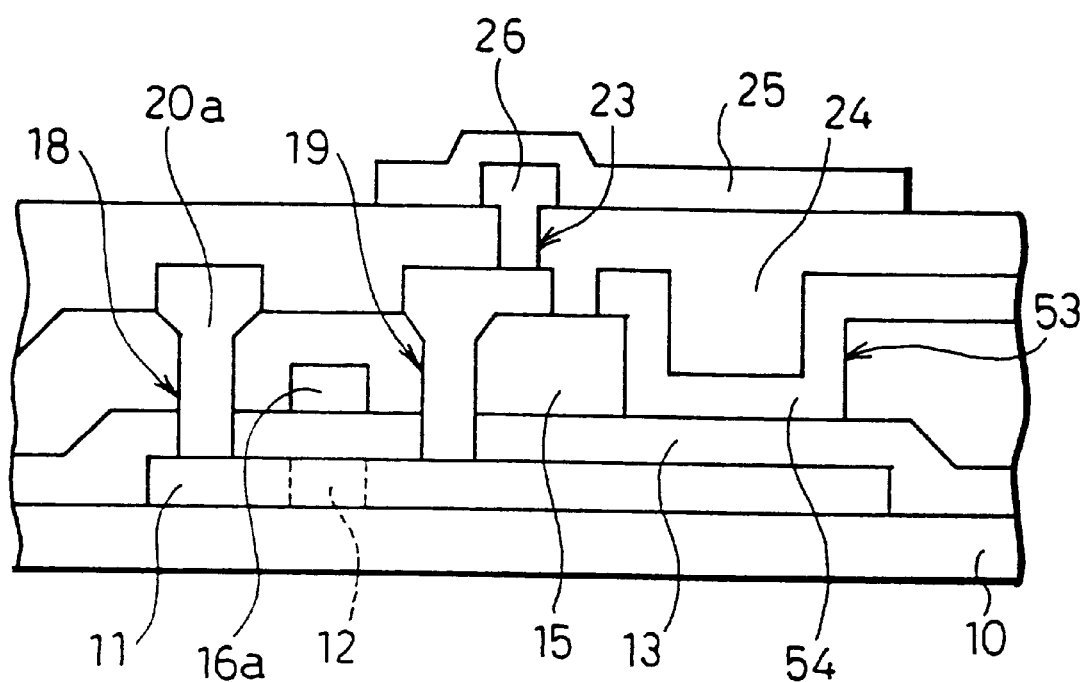
FIG. 11 is a cross-sectional view taken along line E—E in FIG. 10.

FIG. 10 is a drawing which shows a layout of one picture element in the liquid crystal display device according to the present embodiment, and FIG. 11 is a cross-sectional view taken along line E—E in FIG. 10.

As shown in FIGS. 10 and 11, the polycrystal silicon thin film 11 is provided on the insulating substrate 10, and the gate insulating film 13 is provided on the polycrystal silicon thin film 11. The gate electrode 16a made of Al or polycrystal silicon is provided on the gate insulating film 13. The non-doped channel section 12 is provided under the gate electrode 16a, and domains other than the channel section 12 are made high-concentration impurity domains. Moreover, the first inter-layer insulating film 15 is provided so as to cover them, and the contact holes 18 and 19 are formed on the first inter-layer insulating film 15. The source electrode 20a and the drain electrode (piling electrode) 21a are electrically connected to the polycrystal silicon thin film 11 through the contact holes 18 and 19. Moreover, an additional capacity upper electrode 54 is provided on the inner wall of a contact hole 53 formed on the first inter-layer insulating film 15.

In addition, the second inter-layer insulating film 24 is provided on the first inter-layer insulating film 15, and a contact hole 23 is provided on the second inter-layer insulating film 24. The picture element electrode 25 is connected to the drain electrode 21a through the contact hole 23. In order to bring the drain electrode 21a into ohmic contact with the picture element electrode 25, a barrier metal 26 may be formed by using TiW, etc.

The following explains the method of manufacturing the liquid crystal display device having the above arrangement.

FIGS. 12(a) through 12(g) are cross-sectional views which show the steps of the method of manufacturing the liquid crystal display device having the above arrangement.

Figure 12A:
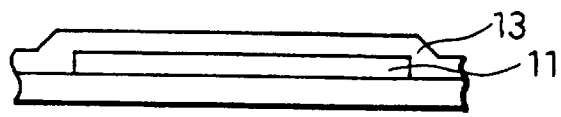
FIGS. 12(a) through 12(g) are cross sectional view which show steps of a method of manufacturing the above liquid crystal display device.

As shown in FIG. 12(a), the polycrystal silicon thin film 11 as an active layer was formed on the insulating substrate 10 made of glass or quartz so as to have a thickness of 40 nm–80 nm. Next, the gate insulating film 13 made of $SiO_2$ or $SiN_X$ was formed on the polycrystal silicon thin film 11 by the sputtering or CVD method so as to have a thickness of 80 nm.

Figure 12B:
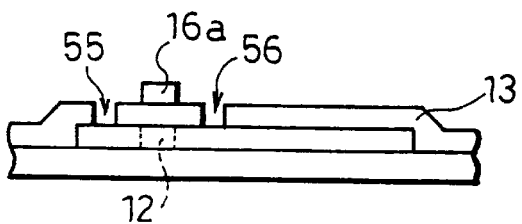

In addition, as shown in FIG. 12(b), the gate electrode 16a made of Al or polycrystal silicon was formed on the gate insulating film 13. Thereafter, $P^+$ with concentration of $1\times10^{15}$ ($cm^{-2}$) were implanted from the upper side of the gate electrode 16a by using the gate electrode 16a as a mask so that the conduction type of the TFT is determined. As a result, the non-doped channel section 12 was formed under the gate electrode 16a in an active layer, and high-concentration impurity domains were formed on domains other than the channel section 12.

If the additional capacity upper electrode 54 was formed by using the same material as the gate electrode 16a, the ion implantation into an additional capacity lower electrode domain as well as the forming of the channel section 12 could not be carried out simultaneously. However in the present embodiment, the channel section 12 is formed and at the same time the resistance of the additional capacity lower electrode can be lowered by the ion implantation. Moreover, the active layer of the TFT may be arranged so that leakage currents in the OFF period of TFT are decreased by providing the low-concentration impurity domain or the non-doped domain to the vicinity of the channel section 12.

Thereafter, contact domains 55 and 56 were formed on the gate insulating film 13 on which the contact holes 18 and 19 will be formed later.

Figure 12C:
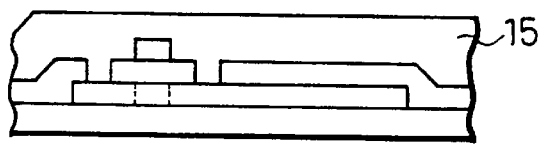

Next, as shown in FIG. 12(c), the first inter-layer insulating film 15 was formed on the whole surface of the substrate 10 by the spin-coating method by using a photosensitive acrylic resin so as to have a thickness of 2.5 μm. Here, the upper surface of the first inter-layer insulating film 15 can be made flat by laminating the first inter-layer insulating film 15 so as to have a thickness of not less than 2 μm.

Figure 12D:
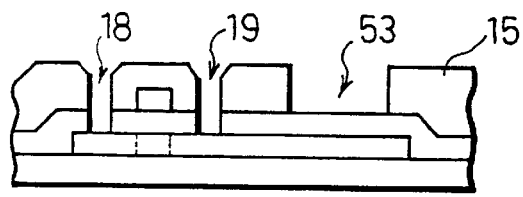

Thereafter, as shown in FIG. 12(d), the contact holes 18 and 19 were formed on the first inter-layer insulating film 15 by the exposing and developing processes. Moreover, at this time, the contact hole 53 which becomes an additional capacity forming section was formed. Since the photosensitive material was used as the first inter-layer insulating film 15, the contact holes 18, 19 and 53 can be formed only by the exposing and developing processes without the etching process, thereby simplifying the manufacturing process. Since the etching process is not performed, the gate insulating film 13 thereunder is not damaged, thereby improving reliability.

Figure 12E:
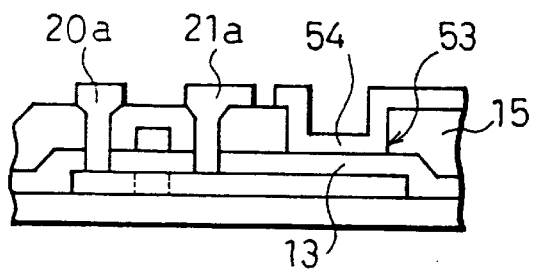

Next, as shown in FIG. 12(e), the source electrode 20a, the drain electrode 21a and the additional capacity upper electrode 54 were formed by using metals such as Al having low resistance. The additional capacity upper electrode 54 was formed so as to cover the inner wall of the contact hole 53.

In addition, the source bus wiring 20 (see FIG. 10) as well as these electrodes was formed. At this time, since the lower surface on which the source bus wiring 20 is provided is made flat by the first inter-layer insulating film 15, disconnection of the source bus wiring 20 due to unevenness of the surface does not occur even in the cross section 57 (see FIG. 10) where the source bus wiring 20 crosses the gate bus wiring 16.

In addition, the photosensitive organic resin material used as the first inter-layer insulating film 15 has smaller dielectric constant than an inorganic material, and its film thickness can be made larger. As a result, a capacity on the cross section 57 where the source bus wiring 20 crosses the gate bus wiring 16 can be ignored, thereby preventing delayed propagation of signals in the bus wiring. Moreover, since Al having low resistance is used as the additional capacity upper electrode 54 and an additional capacity common wiring 54A, the delayed propagation of signals in the additional capacity common wiring 54A does not occur. Moreover, since the additional capacity is formed such that the gate insulating film 13 just under the additional capacity upper electrode 54 is used as a dielectric, the aperture ratio is not lowered.

Figure 12F:
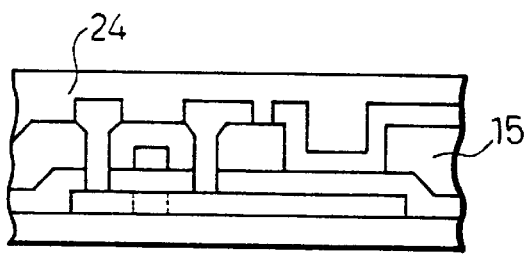
Figure 12G:
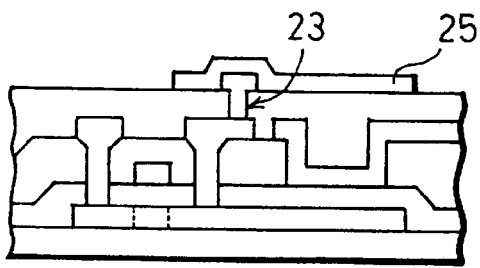

Next, as shown in FIG. 12(f), the second inter-layer insulating film 24 was formed by using the photosensitive acrylic resin similarly to the first inter-layer insulating film 15. Moreover, as shown in FIG. 12(g), the second inter-layer insulating film 24 was exposed and developed so that the contact hole 23 was formed, and the picture element electrode 25 as a transparent conductive film was formed by using ITO. If satisfactory ohmic contact between the drain electrode 21a and the picture element electrode 25 cannot be obtained, the barrier metal 26 may be formed on the contact hole 23.

As mentioned above, in the liquid crystal display device of the present embodiment and its manufacturing method, the delayed propagation of signals does not occur in the additional capacity common wiring 54A. Moreover, a higher aperture ratio can be realized by using the gate insulating film 13 as a dielectric of the additional capacity.

[Embodiment 7]

Figure 13:
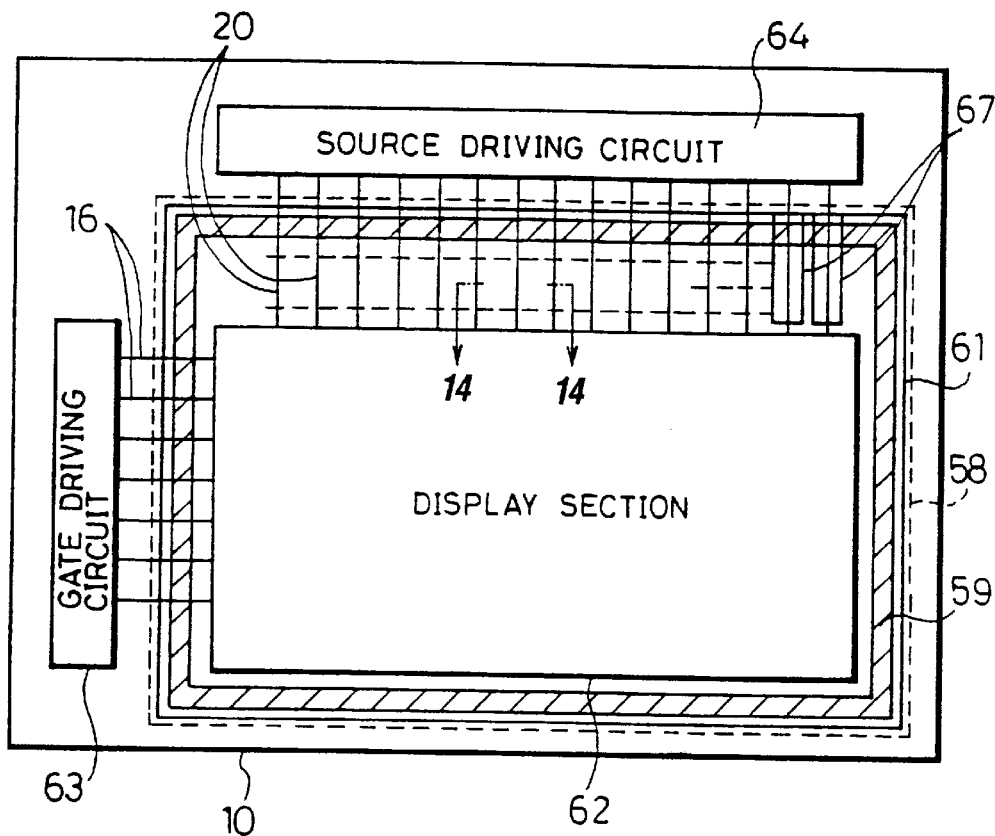
FIG. 13 is a drawing which schematically shows an arrangement of a liquid crystal display device according to still another embodiment of the present invention.
Figure 15:
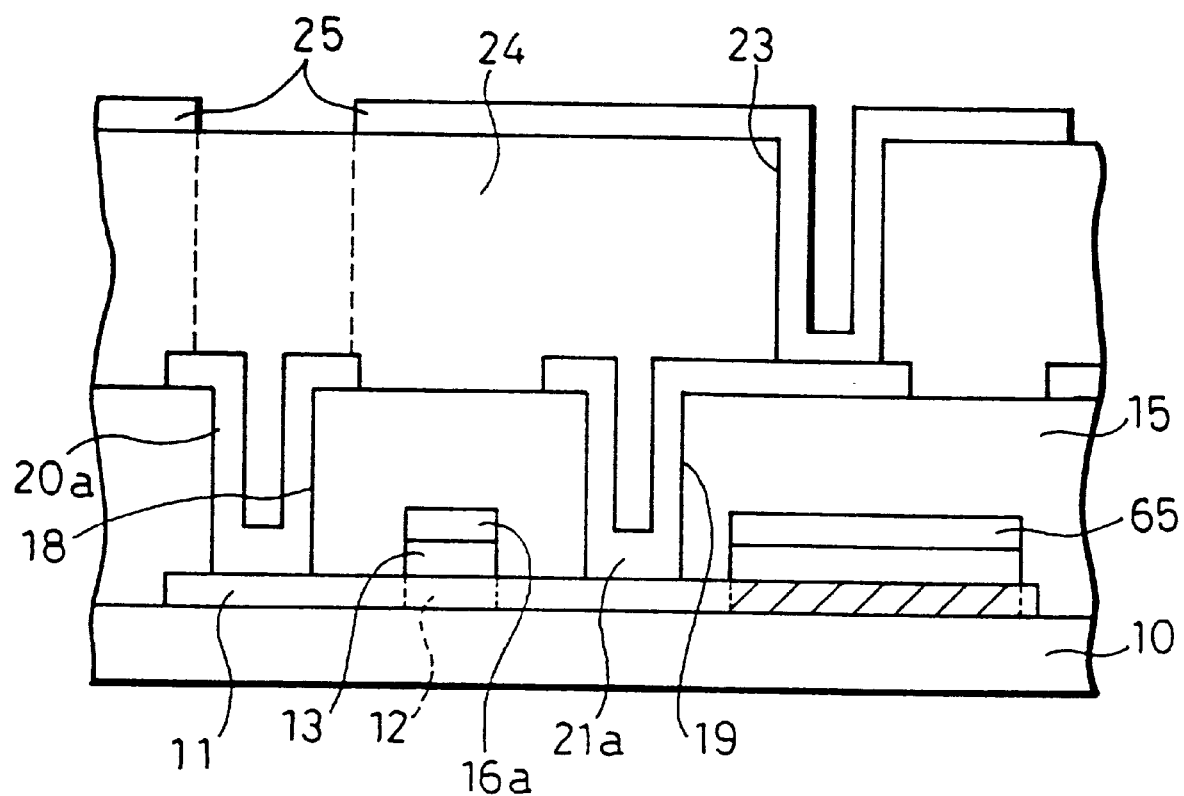
FIG. 15 is a cross-sectional view which schematically shows an arrangement of TFT and an additional capacity in each picture element of the above liquid crystal display device.

The following describes still another embodiment of the present invention in reference to FIGS. 13 and 15. Here, for convenience of explanation, those members that have the same arrangement and functions, and that are described in the aforementioned embodiments are indicated by the same reference numerals and the description thereof is omitted.

Figure 14:
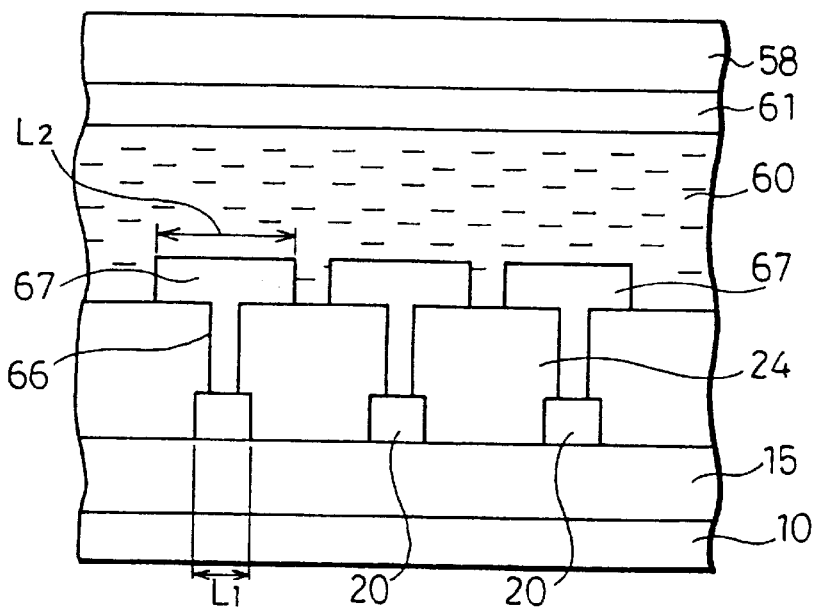
FIG. 14 is a cross-sectional view taken along line F—F in FIG. 13.

FIG. 13 is a drawing which schematically shows an arrangement of the liquid crystal display device of the present embodiment, and FIG. 14 is a cross-sectional view taken along line F—F in FIG. 13. Moreover, FIG. 15 is a cross-sectional view which schematically shows arrangements of the TFT and the additional capacity in each picture element.

As shown in FIG. 13, the liquid crystal display device of the present embodiment has the insulating substrate (TFT substrate) 10 and a counter substrate 58. A display section 62 in which a plurality of picture elements are arranged in a matrix pattern is provided on the TFT substrate 10, and a gate driving circuit 63 and a source driving circuit 64 for driving the picture elements are formed around the display section. The gate bus wiring 16 is extended from the gate driving circuit 63 into the display section 62, and the source bus wiring 20 is extended from the source driving circuit 64 into the display section 62. The gate bus wiring 16 and the source bus wiring 20 are arranged so as to intersect perpendicularly to each other. Moreover, the additional capacity common wiring, not shown, is provided on the display section 62 so as to be parallel with the gate bus wiring 16.

The TFT substrate 10 and the counter substrate 58 are laminated each other by a sealing resin 59, and a liquid crystal material is sealed therebetween so that a liquid crystal layer 60 (see FIG. 14) is formed. When voltages are selectively applied to the liquid crystal layer 60 by the counter electrode 61 formed on the counter substrate 58 and the picture element electrode on each picture element, display is carried out.

The following describes an example of the method of manufacturing the liquid crystal display device according to the present embodiment.

First, the polycrystal silicon thin film 11 which becomes an active layer is formed on the TFT substrate 10 so as to have a thickness of 40 nm–80 nm, and the gate insulating film 13 is formed thereon by the sputtering or CVD method. $SiO_2$ film or $SiN_X$ film can be used as the gate insulating film 13. In the present embodiment, a glass substrate is used as the TFT substrate 10, and the polycrystal silicon thin film 11 is formed thereon so as to have a thickness of 50 nm. Then, the $SiO_2$ film is formed by the CVD method so as to have a thickness of 80 nm. Then, phosphorus ions are implanted into a portion where the additional capacity will be formed later (shaded portion in FIG. 15), namely, a portion under an additional capacity common wiring 65 so that the resistance becomes low.

Thereafter, an Al film or polycrystal silicon film is formed as the gate bus wiring 16 and the additional capacity common wiring 65 so as to be patterned in a desired shape. At this time, the gate insulating film 13 is patterned simultaneously. The gate bus wiring 16 has a protruding section because of the patterning, and this protruding section is used as the gate electrode 16a of the TFT shown in FIG. 15. In the present embodiment, the Al film was formed by the sputtering method so as to have a thickness of 300 nm. After the patterning, phosphorus ions are implanted into the polycrystal silicon thin film 11 from the upper side of the gate electrode 16a by using the gate electrode 16a as a mask so that the conduction type of the TFT is determined. As a result, the non-doped channel domain 12 is formed in the polycrystal silicon thin film 11, and domains in the polycrystal silicon thin film 11 other than the channel domain 12 are made a high-concentration impurity domains. In the present embodiment, the phosphorus ions having concentration of $1 \times 10^{15}$ $(cm^{-2})$ was implanted. Here, the active layer 11 may be arranged so that leakage currents are decreased by providing the low-concentration impurity domain or the non-doped domain to the vicinity of the channel domain 12.

Next, the first inter-layer insulating film 15 is formed on the whole surface of the TFT substrate 10, and the contact holes 18 and 19 are provided thereto. It is preferable that the thickness of the inter-layer insulating film 15 is not less than 2 $\mu$m. In this case, it is possible that the inter-layer insulating film 15 has a flat surface which is not influenced by the existence/non-existence and a shape of each components positioned under the inter-layer insulating film 15. In the present embodiment, a photosensitive acrylic resin was used as the first inter-layer insulating film 15, and this resin having a thickness of 2.5 μm was applied to the TFT substrate 10 by the spin-coating method so that the contact holes 18 and 19 were formed by the exposing an d developing processes. Since the photosensitive insulating material is used, the contact holes can be formed only by the exposing and developing processes, thereby simplifying the manufacturing process.

Next, low-resistant metal films such as Al, which are used as the source electrode 20a and the drain electrode (piling electrode) 21a, are formed, and the low-resistant metal films are patterned in a desired shape so that the source electrode 20a and the drain electrode 21a are obtained. Moreover, the source bus wiring 20 as well as these above electrodes are simultaneously formed. In the present embodiment, the Al film was formed so as to have a thickness of 300 nm.

Then, the second inter-layer insulating film 24 is formed on the whole surface of the TFT substrate 10, and the contact hole 23 is provided thereto. Moreover, the transparent conductive film is formed thereon, and it is patterned in a desired shape so that the picture element electrode 25 is formed. In the present embodiment, similarly to the first inter-layer insulating film 15, the photosensitive acrylic resin was used as the inter-layer insulating film 24, and this resin was applied to the TFT substrate 10 by the spin-coating method so as to have a thickness of 2.5 μm. Thereafter, the contact hole 23 was formed by the exposing and developing processes. Moreover, an ITO film having a thickness of 150 nm was used as the picture element electrode 25. In the case where satisfactory ohmic contact of the drain electrode 21a with the picture element electrode 25 cannot be obtained, a barrier metal may be formed in the contact hole 23. As mentioned above, a display section 62 is formed on the TFT substrate.

In the present embodiment, the thick organic material having small dielectric constant is used as the inter-layer insulating films 15 and 24. For this reason, the capacity of the source bus wiring 20 becomes small, and this causes insufficient contrast. In order to prevent this problem, in the liquid crystal display device of the present embodiment, the capacity is provided to the source bus wiring 20 by utilizing the source bus wiring 20 between the display section 62 and the source driving circuit 64. The following describes the arrangement of a section between the display section 62 and the source driving circuit 64 in the liquid crystal display device of the present embodiment on reference to FIG. 14.

As s how n in FIG. 14, in the section between the display section 62 and the source driving circuit 64, the source bus wiring 20 is formed on the first inter-layer insulating film 15 having a flat surface, and the second inter-layer insulating film 24 is formed on the source bus wiring 20 so as to cover the whole surface of the TFT substrate 10. The contact hole 23 for connecting the drain of the TFT and the picture element electrode 25 is formed in the section of the inter-layer insulating film 24 in the display section 62 as mentioned above, but in the section between display section 62 and the source driving circuit 64, as shown in FIG. 14, contact holes 66 are formed on the respective source bus wirings 20. In the present embodiment, since the photosensitive acrylic resin is used as the inter-layer insulating film 24, the contact holes 66 are formed only by the exposing and developing processes.

Next, a covered electrode 67 is formed so as to cover the source bus wiring 20 between the display section 62 and the source driving circuit 64. In FIG. 13, for simplification of the drawing, only a part of the covered electrode 67 is shown, but the covered electrode 67 can be provided on all the source bus wirings 20. The covered electrode 67 is formed simultaneously with the picture element electrode 25 by patterning a transparent conductive film to be the picture element electrode 25. When a width $L_2$ of the covered electrode 67 is made wider than a width $L_1$ of the source bus wiring 20, the capacity can be formed effectively. In the present embodiment, the width $L_1$ of the source bus wiring 20 was 5 μm, and the width $L_2$ of the cove red electrode 67 was 20 μm. The covered electrode 67 faces the counter electrode 61 formed on the counter substrate 58 across the liquid crystal layer 60 so that the capacity is formed. Electric charges written to the source bus wiring 20 are held by the capacity. In the present embodiment, in order to prevent the problem of insufficient contrast, a capacity 2 pF was formed by the covered electrode 67 and the counter electrode 61. The width $L_2$ of the covered electrode 67 is determined so that enough capacity for holding electric charges is secured.

As mentioned above, in the liquid crystal display device of the present embodiment, the capacity for holding the electric charges written to source bus wiring 20 is formed between the display section 62 on which a plurality of picture elements are arranged and the source driving circuit 64. Therefore, even if an inter-layer insulating film having small dielectric constant is used, displaying with sufficient contrast can be performed.

In addition, in the liquid crystal display device of the present embodiment, the wiring between the display section 62 and the source driving circuit 64 has a two-layered structure composed of the wiring 20 and the covered electrode 67. Disconnection can occur in the section to which the sealing resin 59 was applied when the TFT substrate 10 and the counter substrate 58 are laminated to each other. The above two-layered structure is successful for preventing the disconnection. In the two-layered structure, disconnection of the gate bus wiring 16 can be also prevented by providing the covered electrode to the sealed portion of the gate bus wiring 16.

In addition, in the liquid crystal display device of the present embodiment, even if the source bus wiring 20 is in the display section 62 or between the display section 62 and the source driving circuit 64, the source bus wiring 20 can be covered with a transparent conductive film. In this case, when the picture element electrode 25 and the covered electrode 67 are formed by etching a transparent conductive film, the source bus wiring 20 is not damaged by etchants, thereby preventing the disconnection of the source bus wiring 20 at the time of etching the transparent conductive film.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A switching element substrate comprising:
   a non-monocrystal silicon thin film, a gate insulating film and a gate bus wiring provided above a substrate;
   a first inter-layer insulating film, a source bus wiring, a second inter-layer insulating film and a picture element electrode provided above said gate bus wiring; and
   an additional capacity including an additional capacity upper electrode and an additional capacity lower electrode, the additional capacity upper electrode covering a hole provided in said first inter-layer insulating film and being made of the same material as said source bus wiring, the additional capacity lower electrode being made of one part of said non-monocrystal silicon thin film.

2. The switching element substrate according to claim 1, wherein said first inter-layer insulating film is made of a photosensitive organic material.

3. The switching element substrate according to claim 1, wherein said non-monocrystal silicon thin film, said gate insulating film and said gate bus wiring are provided above the substrate in this order.

4. The switching element substrate according to claim 1, wherein said first inter-layer insulating film, said source bus wiring, said second inter-layer insulating film and said picture element electrode are provided above the gate bus wiring in this order.

5. The switching element substrate according to claim 1, wherein said first inter-layer insulating film or said second inter-layer insulating film is made of an organic material, and said switching element substrate further includes an additional capacity common wiring which is electrically connected to the additional capacity and which is parallel to the source bus wiring and made of the same material as that of the source bus wiring.

6. The switching element substrate according to claim 1, wherein said additional capacity is made using said gate insulating film.

7. The switching element substrate according to claim 1, wherein said hole is formed in accordance with a size of said additional capacity upper electrode.

8. The switching element substrate according to claim 1, wherein said hole is made in a thickness direction with respect to said first inter-layer insulating film.

9. The switching element substrate according to claim 8, wherein said hole goes through said first inter-layer insulating film.

10. The switching element substrate according to claim 1, wherein said additional capacity upper electrode is formed on said gate insulating film inside said hole.

11. A method of manufacturing a switching element substrate which includes a non-monocrystal silicon thin film, a gate insulating film and a gate bus wiring above a substrate;

a first inter-layer insulating film, a source bus wiring, a second inter-layer insulating film and a picture element electrode above said gate bus wiring, said method comprising:

forming an additional capacity lower electrode by one part of said non-monocrystal silicon film;

forming a hole in said first inter-layer insulating film; and forming an additional capacity upper electrode by the same material as that of said source bus wiring so that said additional capacity upper electrode covers said hole.

12. The method according to claim 11, further comprising forming said first inter-layer insulating film by a photosensitive organic material.

13. The method according to claim 11, further comprising forming said non-monocrystal silicon thin film, said gate insulating film and said insulating gate bus wiring in this order above the substrate.

14. The method according to claim 11, further comprising forming said first inter-layer insulating film, said source bus wiring, said second inter-layer insulating film and said picture element electrode in this order above the gate bus wiring.

15. The method according to claim 11, wherein said hole is formed simultaneously with respective contact holes of the source bus wiring and the picture element electrode.

16. The method according to claim 12, wherein said hole is formed with respect to said first inter-layer insulating film by irradiation of light on said photosensitive organic material.

* * * * *